United States Patent [19]

Hyatt

[11] Patent Number: 4,486,850
[45] Date of Patent: Dec. 4, 1984

[54] INCREMENTAL DIGITAL FILTER

[76] Inventor: Gilbert P. Hyatt, 4592 Amberwood, La Palma, Calif. 90623

[21] Appl. No.: 754,660

[22] Filed: Dec. 27, 1976

Related U.S. Application Data

[63] Continuation-in-part of Ser. No. 522,559, Nov. 11, 1974, , and a continuation-in-part of Ser. No. 550,231, Feb. 14, 1975.

[51] Int. Cl.³ .......................... G06F 15/34; G06J 1/00
[52] U.S. Cl. .................................. 364/747; 364/724; 364/726; 364/604
[58] Field of Search ............... 364/724, 725, 726, 727, 364/728, 747, 702, 604, 572, 576; 333/7; 324/77

[56] References Cited

U.S. PATENT DOCUMENTS

| | | | |
|---|---|---|---|
| 3,033,453 | 5/1962 | Lode | 364/747 |
| 3,197,621 | 7/1965 | Urquhart | 364/747 |
| 3,479,495 | 11/1969 | Malm | 364/819 |
| 3,514,757 | 5/1970 | Weintraub | 364/747 |
| 3,544,775 | 12/1970 | Bergland et al. | 364/726 |
| 3,581,078 | 5/1971 | Robertson | 364/827 |
| 3,633,170 | 1/1972 | Jones, Jr. | 364/724 |
| 3,903,401 | 9/1975 | Jayant | 324/77 B |
| 3,906,400 | 9/1975 | Gooding et al. | 364/724 |
| 4,023,028 | 5/1977 | Dillard | 364/726 |
| 4,058,715 | 11/1977 | Niwa | 364/726 |

OTHER PUBLICATIONS

Nakamura: A Digital Correlator using Delta Modulation, IEEE Transactions on Acoustics, Speech, and Signal Processing, vol. ASSP-24, No. 3, Jun. 1976, pp. 238/243.

Primary Examiner—Felix D. Gruber
Attorney, Agent, or Firm—Gilbert P. Hyatt

[57] ABSTRACT

An incremental digital filter provides high speed and low cost capability such as for performing fast Fourier transforms (FFTs), correlations, convolutions, and other digital filter operations. One configuration operates at microwave sample rates, computing a complete 512-point FFT in 0.2 microseconds for an effective sample rate of 2.56 gigahertz. High speed and low cost are derived from a parallel pipeline architecture in combination with incremental processing. Parallel pipeline architecture provides extremely high speed while the incremental mechanization provides a simple arrangement with a low component count for low cost. The incremental nature of the processor provides an integrating type mechanization, where integration-after-transformation yields high processing gain for signal-to-noise-ratio enhancement.

High data rate input and output mechanizations are provided to accommodate the high processing rates. An improved input mechanization involves analog signal to incremental digital conversion. An improved output mechanization involves integration after filtering for data rate reductions and for signal enhancement and also involves a bus output structure for multiplexing of output parameters.

39 Claims, 21 Drawing Figures

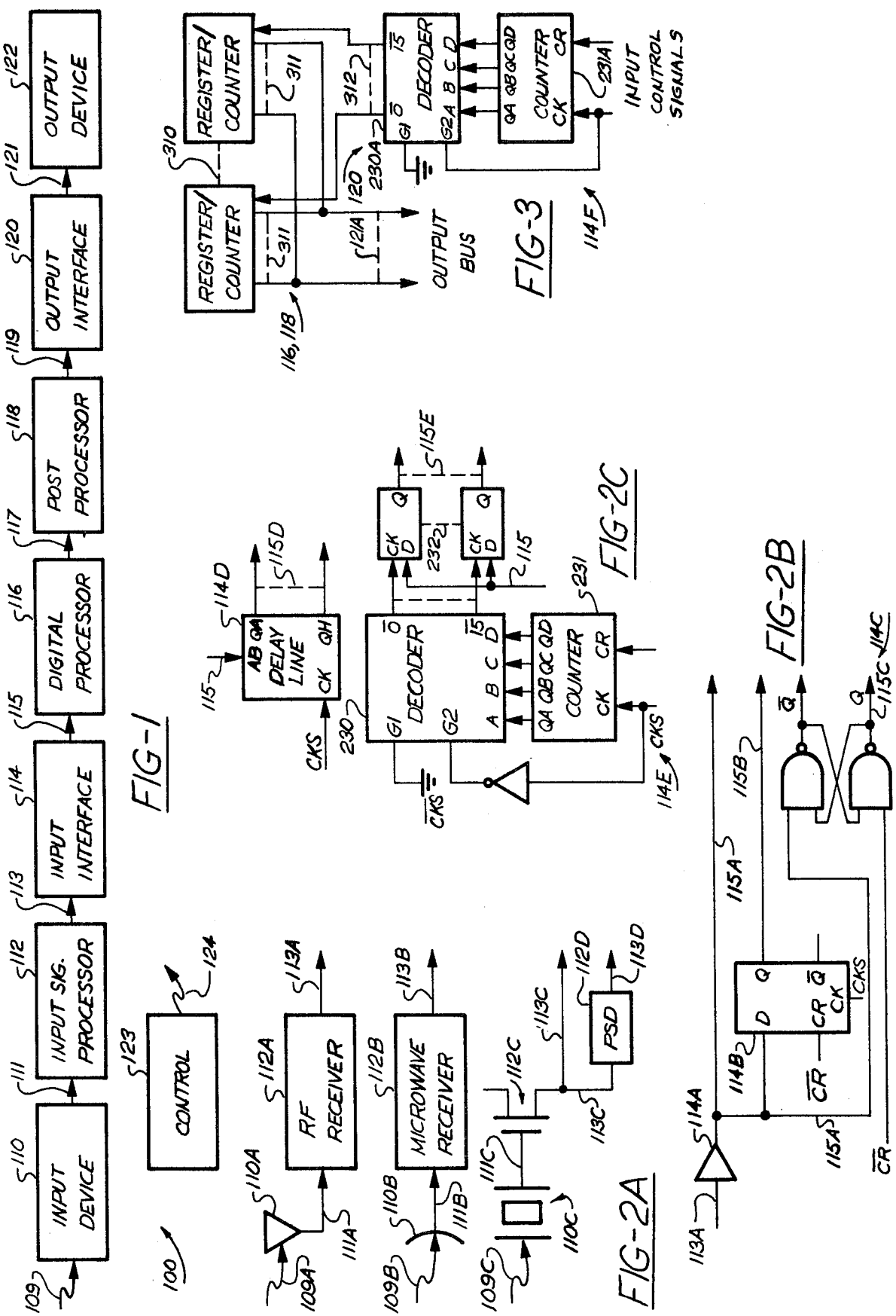

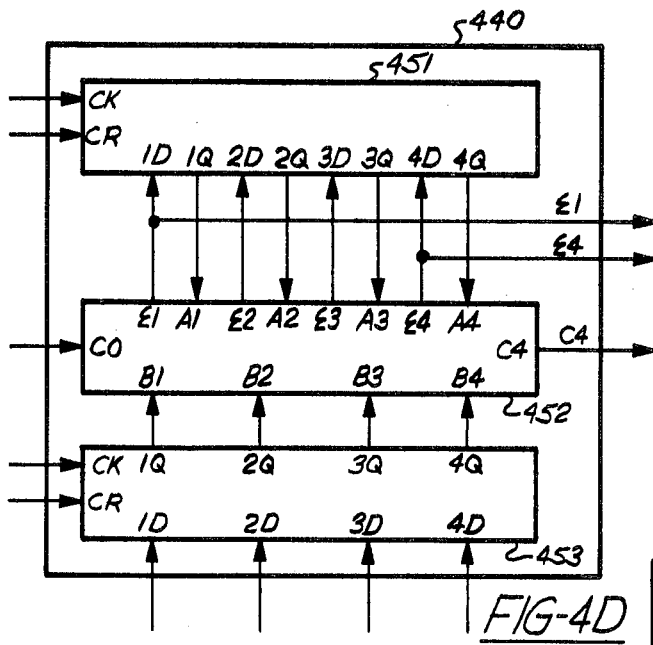
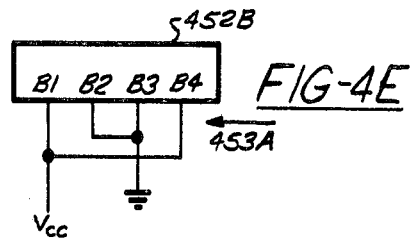
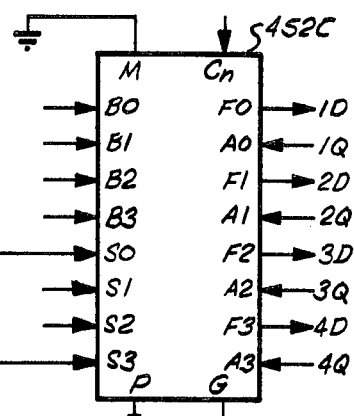
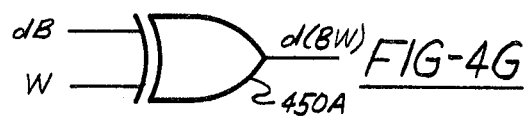
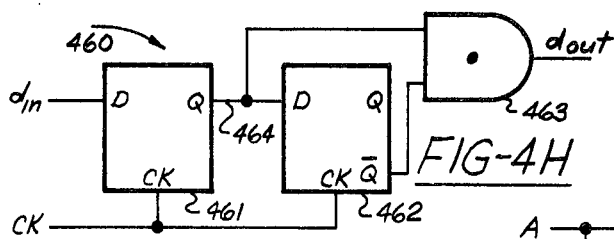
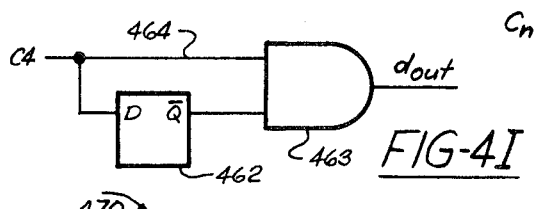
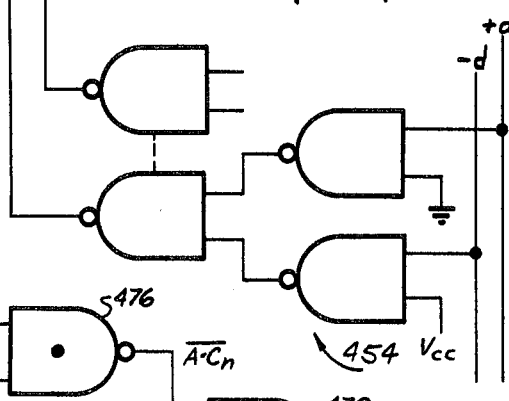
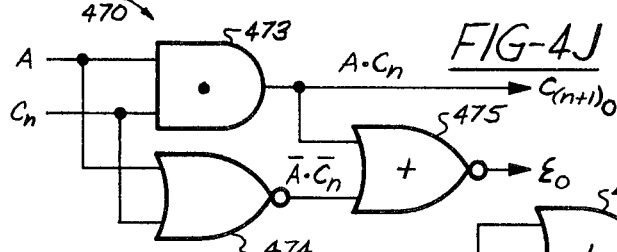
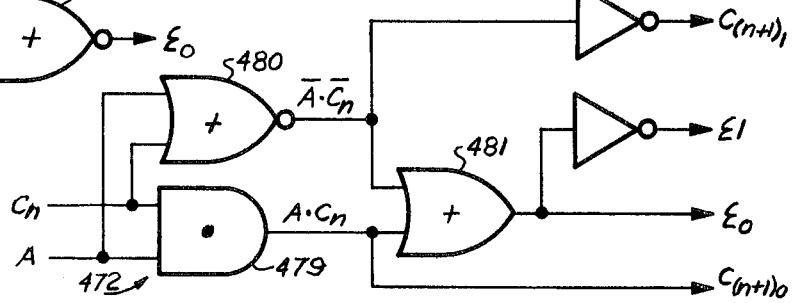

INCREMENTAL DIGITAL FILTER

CROSS REFERENCE TO RELATED APPLICATIONS

The instant application is a continuation in part of copending U.S. patent application Ser. No. 522,559 filed on Nov. 11, 1974 by Gilbert P. Hyatt entitled Signal Processing And Memory Arrangement and copending U.S. Pat. application Ser. No. 550,231 filed on Feb. 14, 1975 entitled Method and Apparatus For Signal Enhancement With Improved Digital Filtering by Gilbert P. Hyatt wherein the benefit of the filing dates of each of said copending applications and of the applications referenced therein are herein claimed in accordance with the U.S. Code such as with 35 USC 120 and 35 USC 121 and the instant application is related to U.S. Pat. No. 3,586,837 entitled Electrically Alterable Digital Differential Analyzer issued on June 22, 1971; wherein said patent and copending applications except for material in said copending applications that is incorporated-by-reference therein are herein incorporated-by-reference as if fully set forth at length herein.

BACKGROUND OF THE INVENTION

1. Field of the invention

This invention relates to digital data processing systems and, in particular, to a Fourier transform processor using incremental processing means and methods.

2. Description of the prior art

Digital data processors and, in particular, digital Fourier transform processors are conventionally implemented as whole-number processing devices either in software with a general purpose digital computer in firmware with a micro-programmable processor, or with special purpose hardwired logic. A digital filter is conventionally implemented with sum-of-the-products computations, where array multiplier integrated circuits are used to provide whole-number multiplication capability. Whole-number multiplication circuitry is complex and expensive and therefore has only been qualified as time-shared arithmetic circuitry for sequential processing architecture. Such sequential processing is relatively slow, where a single complex (real and imaginery) multiplication operation may be performed in a microsecond with conventional type higher speed processors and where 2,304 complex multiply operations must be performed in sequence to implement a 512-point FFT, representing 2.3 milliseconds per FFT computation for higher speed conventional FFT processors. This rate is adequate for many applications but has precluded processing of signals at microwave sampling rates.

Fourier processors can be implemented in many forms including the discrete Fourier transform (DFT) and the fast Fourier transform (FFT) implemented with digital electronics, spectrum analyzers implemented with analog electronics, illumination processors implemented with analog electro-optics, and acoustical processors implemented with analog surface acoustic wave (SAW) devices. The analog illumination and analog acoustical processors are the highest speed and lowest cost devices, followed by the analog electronic processors and then by the digital electronic processors.

Digital processors have the lowest speed and highest cost, but digital processors have a major advantage, high resolution. Digital processors have virtually unlimited resolution; which extrapolates into high accuracy, high dynamic range, and high signal-to-noise-ratio (SNR) enhancement.

Although input signals are typically analog and are therefore limited to a resolution of about one-part-per-thousand, precision is significantly enhanced with processing gain inherent in Fourier transformation. Processing gain can be further enhanced almost without limit with coherent integration-after-transformation. Therefore, a digital transform processor generates high accuracy output information such as 20-bit (one-part-per-million) output information from low accuracy input information such as 7-bit (one-part-per-hundred) input information with Fourier transform and integration processing gain.

Analog filtering technologies achieve enhanced accuracy through processing gain, but analog processing precludes accuracy beyond a practical limit which is typically 10-bits (one-part-per-thousand). Therefore, the analog technologies are severely limited and can only be used for low accuracy applications.

FFT processors are universally implemented with complex (real and imaginary) multiply operations, where each complex multiply together with auxiliary processing operations is called a "butterfly" operation because of the appearance on an FFT diagram. Just as with conventional processors, the processor of the present invention can implement an FFT with conventional interconnection of butterfly operations.

Programmable FFT processors presently dominate the market. General purposes (GP) stored program computers are widely used for low speed FFT requirements when the processor is time-shared for both general purpose and FFT processing requirements. Special purpose (SP) micro-programmable array transform processors are widely used for higher speed FFT requirements. These SP processors may be 100-times faster than the GP processors, but they typically operate in conjunction with a GP host processor for GP processing capability. GP processors and SP processors both operate on a parallel word, sequential computation basis. Each butterfly operation is synthesized with four multiply and four addition operations and with various overhead operations in sequence. The FFT is then synthesized with all butterfly operations processed in sequence. This sequential operation of programmable FFT processors significantly reduces speed.

SUMMARY OF THE INVENTION

The Ultra-fast Fourier Transform (UFT)$^{TM}$ processor of the present invention represents a major advance in the state-of-the-art of digital transform processors, providing 1,000-times performance/price advantage over conventional FFT processors. As the performance/price characteristic of digital processors improves, the UFT will maintain it's advantages because the UFT advantages are based upon a unique processor architecture that significantly reduces component count and significantly enhances speed, where this inherent advantage will be preserved even as levels of circuit integration increase and cost of components decrease.

The UFT is optimized for enhancing small signals particularly in high noise environments with integration-after-transformation.

An important application of filter processors is in retrieving small signals engulfed in noise. The high processing gain inherent in a Fourier transform and the huge processing gain obtained with coherent integrating-after-transformation permits very small signals to be retrieved from extensive superimposed noise. For example, the signal-to-noise ratio can be enhanced by factors of one-thousand to one-million by proper digital filtering. In contrast, analog processors cannot provide such capabilities because of the uncontrollable high level analog errors and existing digital processors are relatively low in speed and high in cost.

Therefore, many applications requiring high accuracy and/or SNR enhancement cannot use analog processors but must use digital Fourier transform processors having high processing gain that is enhanced with integration-after-transformation. The UFT is configured for such applications, preserving the inherent processing gain of an FFT and enhancing the processing gain with self-contained coherent integration-after-transformation.

Many requirements involve processing of small signals in high noise environments to enhance signal-to-noise ratio (SNR). Other requirements involve frequency-domain processing such as correlation. The UFT is optimized for processing signals having a low SNR with frequency-domain coherent integration included in the basic UFT processor. Therefore, the processing gain of the FFT is significantly enhanced with frequency-domain integration to obtain meaningful information from signals that are virtually lost in the noise.

Frequency-domain post processing can be implemented with the UFT computational architecture, providing high speed and low cost as discussed for the UFT processing. Implementation of frequency-domain coherent integration, followed by frequency-domain correlation, followed by frequency-doxain noncoherent integration can be implemented with incremental post processing logic.

In a radar application, spread spectrum signals are received and processed for identification and for direction-finding. Two antennas receive phase-related direction information, which is sampled at a 100-MHz rate and processed with a pair of 512-point UFT processors. The two transformed arrays are coherently multiplied together in the frequency-domain with a 512-point parallel multiplier, transformed to a noncoherent array, and noncoherently integrated for one second.

The processing requirements can be implemented with a pair of 512-point UFT processors operating at a 100-MHz sample rate (five-microsecond transform period) and having a self-contained frequency-domain coherent multiplier, noncoherent RSS computation, and noncoherent integrator. The UFT integrates the transformed products in the frequency-domain for one second, then outputs the filtered information to a supervisory GP computer for low speed transformation into the time-domain. The five micro-second 512-point transform period permits use of a MOS-FET UFT configuration.

A conventional FFT is implemented as a set of parallel and sequential complex multiplication operations, where each complex multiply operations is called a "butterfly" operation because of the appearance in a graphical representation of interconnections. Interconnection of "butterfly" operations with proper scaling implements an FFT. Virtually any FFT algorithm can be implemented with the UFT, where the UFT provides a significantly more efficient mechanization of the butterfly computation used in the conventional FFT computations.

The UFT utilizes a parallel pipeline architecture to obtain the ultra-high speed capability and utilizes a unique non-conventional butterfly implementation to acheive a low price. The UFT high speed and low price yields a significant improvement over any commercially available FFT processor and any anticipated state-of-the-art digital FFT processor.

An object of this invention is to provide an improved digital data processor.

A further object of this invention is to provide an improved incremental data processor.

A still further object of this invention is to provide an improved digital filter.

A yet still further object of this invention is to provide an incremental digital filter.

Yet another object of this invention is to provide an incremental fast Fourier transform processor.

Yet another object of this invention is to provide a high speed digital filter.

Still a further object of this invention is to provide a low cost digital filter processor.

Yet another object of this invention is to provide an improved input arrangement for a digital filter processor.

Yet still another object of this invention is to provide an incremental input arrangement.

A yet still further object of this invention is to provide a microwave frequency sampling arrangement.

Yet another object of this invention is to provide an incremental post processing arrangement.

Yet another object of this invention is to provide an improved low data rate output from a high data rate processor.

A still further object of this invention is to provide an improved externally controllable output bus arrangement.

Yet another object of this invention is to provide a simplified incremental multiplier arrangement.

The foregoing and other objects, features, and advantages of this invention will become apparent from the following detailed description of preferred embodiments of this invention, as illustrated in the accompanying drawings.

BRIEF DESCRIPTION OF THE DRAWINGS

A better understanding of the invention may be had from a consideration of the following detailed description taken in conjunction with the following drawings FIG. 1 is a block diagram of a digital processing arrangement in accordance with the present invention.

FIG. 2A is a block and schematic diagram of processor input arrangements in accordance with the present invention comprising.

FIG. 2B showing input transducer and signal processor arrangements and

FIG. 2C showing input interface arrangements in accordance with the system shown in FIG. 1.

FIG. 3 is a logical diagram of an output interface arrangement in accordance with the system shown in FIG. 1.

Figure 4A:
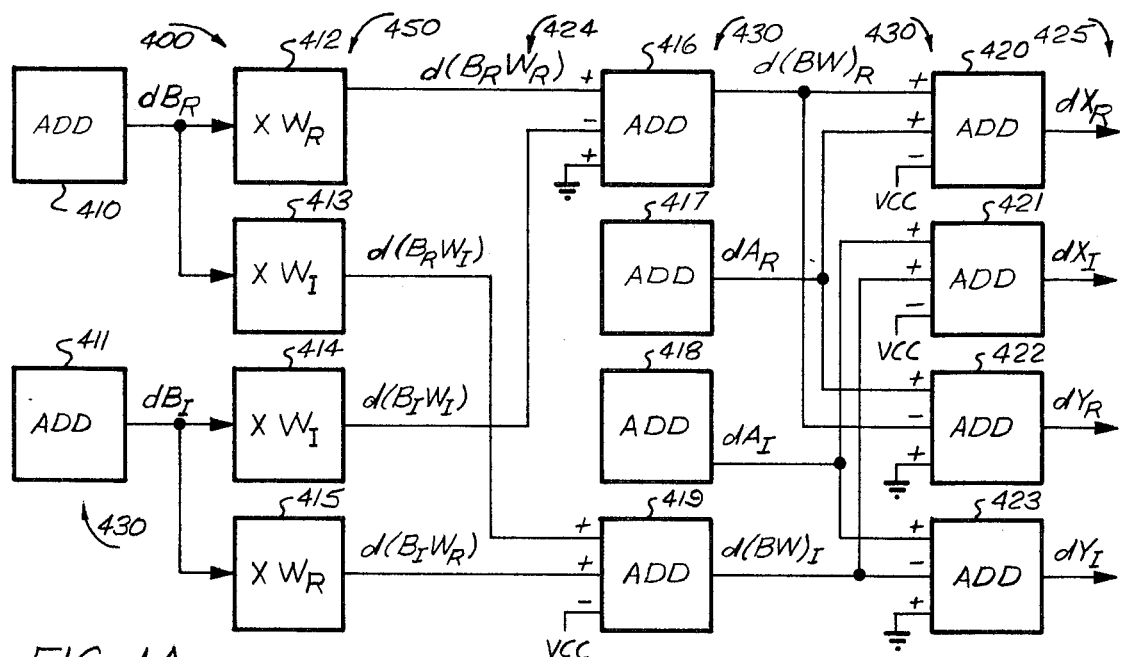
FIG. 4 is a block and schematic diagram of a digital FFT processor in accordance with the system shown in FIG. 1 comprising FIG. 4A showing a butterfly computation, FIG. 4B showing an incremental adder, FIG. 4C showing an incremental multiplier, FIG. 4D showing a programmable constant incremental multiplier, FIG. 4E showing a wired constant incremental multiplier, FIG. 4F showing an ALU incremental multiplier, FIG. 4G showing an exclusive-OR incremental multiplier, FIGS. 4H and 4I showing a synchronous one-shot output circuit.
FIGS. 4J-4L show implied constant incremental multiplier logic in accordance with a preferred embodiment of the present invention.

By way of introduction of the illustrated embodiment, the components shown in the figures have been assigned general reference numerals and a description of each such component is given in the following detailed description. The components in the figures have been assigned three-digit reference numerals wherein the hundreds-digit of the reference numeral is related to the figure number except that the same component appearing in successive figures has maintained the first reference numeral. For example, the components in FIG. 1 have one-hundred series reference numerals (100 to 199) and the components in FIG. 2 have two-hundred series reference numerals (200 to 299).

Reference numerals may herein be presented without alphabetical characters or with alphabetical characters; wherein corresponding reference numerals with or without alphabetical characters show relationships therebetween and alphabetical characters show alternatives therebetween. For example, input device 110 is shown in FIG. 1 in generalized input device form and alternates thereof are shown in FIG. 2A as input devices 110A, 110B, and 110C; wherein these alternate devices include the reference numeral 110 to show a relationship to input device 110 (FIG. 1) and further include alphabetical designations to identify distinctions between the alternate embodiments.

DETAILED DESCRIPTION OF THE PRESENTLY PREFERRED EMBODIMENT OF THE INVENTION

System Description

The digital processor arrangement of the present invention can take any of a number of possible forms. Preferred embodiments of several features of the present invention are shown in the accompanying figures and will be described in detail hereinafter.

The system of the present invention is exemplified with the simplified block diagram shown in FIG. 1. Input signal 109 is received by input device 110 for generating transducer output signal 111. Input signal processor 112 processes transducer signal 111 to generate processed signal 113. Input interface 114 interfaces input signal processor 112 to the digital processor of the present invention 116 by generating processor input signal 115 in response to output signal 113 from signal processor 112. Digital Processor 116 generates processed output signal 117 in response to processed input signal 115. Post processed signal 119 is generated by post processor 118 in response to processor output signal 117. Output interface 120 generates output signal 121 to output device 122 in response to post processed signal 119. Control 123 generates control signals 124 to control system 100.

In accordance with one feature of the present invention, a high data rate input capability and a data rate reduction capability are provided. Input circuitry including input signal processor 112 and input interface 114 are inherently high speed circuits compared to conventional circuits such as whole-number analog to digital converters. For example, such whole-number converters typically operate at an 0.1-MHz conversion or sample rate and the highest speed video whole-number converters may operate close to 50-MHz; but microwave amplifiers and high speed digital logic can operate at 1000-MHz (1-GHz). Further, conventional analog to digital converters are complex and expensive devices compared to amplifiers and flip-flops, wherein the amplifier and flip-flop arrangements of the present invention, shown in FIGS. 2B and 2C, are inherently less expensive and higher speed than conventional analog to digital converters. Further, the integration-after-transformation feature of the present invention can significantly reduce output data rates. For example, transforms may be provided at a 1-MHz transform rate and may be integrated for a 1-second period of time (1-million integrations), where the output data rates may therefore be reduced by a factor of 1-million times.

In view of the above, the very high speed capability of the processor of the present invention is supplemented by the very high speed efficient input mechanization and interfacing to output devices is enhanced by reduction in output data rates; thereby improving feasibility, utilization and interfacing of the processor of the present invention.

The UFT provides state-of-the-art speed capability using conventional circuits and represents a 1,000-times performance/price improvement over the closest digital alternative and providing advantages impossible with analog alternatives. It is optimized for processing signals having a low signal-to-noise ratio by using frequency-domain coherent and noncoherent integration. A unique UFT processing concept is used in combination with a parallel pipeline architecture to obtain ultra-high speed at low cost. The UFT can be implemented at low development cost with existing MSI and PC board technology, then evolve to the highest levels of integration still preserving the UFT advantages. State-of-the-art performance can be provided at prices of conventional FFT processors.

In many applications, it is necessary to integrate or composite many sets of input samples to enhance the signal-to-noise ratio (SNR). This integrating is performed before transformation because conventional transform processors cannot handle the full data rate, where integrating reduces the data rate. This integrating-before-transformation causes detremental affects, such as smearing the spectrum when tracking a moving target. The processor of the present invention transforms input samples in real time at high data rates. Therefore, raw data can be transformed and then integrated in the frequency-domain, such as for frequency-domain correlation. This integrating-after-transformation provides important advantages such as reduction in smearing and correlation against many different signatures.

Processing of incremental or single-bit signals, integration-after-filtering, SNR enhancement, etc. are discussed in detail in the referenced application Means And Method For Signal Enhancement With Improved Digital Filtering.

UFT architecture permits repeated use of a single basic computational element. Therefore, design of a single custom MSI integrated circuit will significantly reduce cost, size, weight, and power and will significantly enhance reliability. This special circuit could be a MOS FET circuit for lower cost or a bipolar circuit for higher speed.

Input Arrangement

An input arrangement will now be discussed comprising input device 110, input signal processor 112, and input interface 114 with reference to FIG. 2.

Input device 110 may be one of a large number of different types of input devices, some of which are discussed with reference to FIG. 2A.

Input device 110 may be an RF antenna 110A for receiving RF signals 109A and generating antenna signals 111A to an RF receiver 112A to generate receiver output signals 113A. Alternately, input device 110 may be a microwave antenna 110B for receiving microwave signals 109B to provide microwave output signals 111B to microwave receiver 112B which generates output signal 113B. RF receiver 112A and microwave receiver 112B may include phase locked loops; hetrodyne circuits; superhetrodyne circuits; RF and/or microwave amplifiers, IF circuits, demodulators and other well known receiver circuits.

Input device 110 may be an acoustical type transducer such as used in seismic and underwater detection systems. Underwater acoustical systems are described in copending application Signal Processing And Memory Arrangement and seismic systems are described in copending application Method And Apparatus For Signal Enhancement With Improved Digital Filtering, which are herein incorporated-by-reference. An acoustical transducer 110C receives acoustical input signal 109C to generate electrical signal 111C which xay be processed with a field effect transistor (FET) 112C to generate amplified and isolated signal 113C. Amplified signal 113C may be processed with a phase sensitive demodulator (PSD) 112D to generate demodulated signal 113D.

Many other types of input devices such as transducers may be used for inputting signals to the processor of the present invention, wherein multitudes of other types of input devices and transducer devices are well known in the art.

Input signal processor 112 receives input signal 111, which may be an analog input signal, and generates output signal 113, which may be a digital output signal. Signal processor 112 may be an analog-to-digital converter such as conventional analog to whole-number digital converters for use with a whole number digital processor as discussed in copending application Signal Processing And Memory Arrangement which is herein incorporated-by-reference or may be an analog to incremental digital converter for use with an incremental digital processor.

One form of analog to incremental converter is a Fairchild uA710 amplifier which may be considered a zero crossing detector, threshhold detector, or analog to incremental converter. As shown in FIG. 2B, input signal 113A may be an analog signal and output signal 115A may be an incremental binary output signal. Alternately, input signal 113A may be processed with said uA710 circuit to generate digital signal 115A which may be latched in latch 114B to generate latched binary incremental output signal 115B. The latch may be a synchronous flip-flop 114B or an asynchronous latch 114C. Flip-flop 114B may be clocked with clock signal CKS and may be cleared with clear signal CR using well known control logic such as a free running clock signal CKS and an externally or internally generated clear signal CR generated at the start of sampling. Alternately, unclocked asynchronous latch 114C may be used to latch binary signal 115A as latched output signal 115C, where latch 114C may be cleared with clear signal CR such as at the start of a sampling period.

Flip-flop 114B may be any well known flip-flop such as an SN7474 D flip-flop for latching input signal 115A as output signal 115B. Clear signal CR may be initiated for system turn-on, system initialization, or other such operational condition.

Asynchronous latch 114C may be synthesized with gates such as SN7400 NAND-gates or with an SN74279 MSI quadruple latch circuit. Clear signal CR may clear latch 114C prior to sampling signal 115A, then latch 114C will be set with a low condition for input signal 115A and will not be set for a high condition of input signal 115A. Latch 114C provides an inversion from input signal to output signal, where the complemented input signal 115A is provided at the $\bar{Q}$ output and the uncomplemented input signal 115A is provided at the Q output.

Processor 116 and post processor 118 may be any digital processor such as a stored program digital computer, micro-programmed processors, or hardwired processors. In a preferred embodiment processors 116 and 118 are incremental processors, which are discussed in detail herein.

Input arrangement 110 and 112 may represent a single input channel or an array of input channels. Various configurations of input device 110 and input signal processor 112 are described herein with reference to FIG. 2A and various configurations of input interface 114 are described herein with reference to FIG. 2B, where these alternative arrangements may be used individually as a single input channel or may be duplicated in parallel form for an array of parallel input channels. A two-dimensional array of spacial-domain parallel input channels is described in copending application Signal Processing And Memory Arrangement and an array of spacial-domain input channels and temporal-domain input signals for each spacial -domain channel are described in copending application Method And Apparatus For Signal Enhancement With Improved Digital Filtering, which are herein incorporated-by-reference.

Single channel input signals such as temporal-domain input signals may be converted to parallel array signals with arrangements such as shown in FIG. 2C for processing with parallel data processor 116. Processed signal 113A may be processed with amplifier 114A (FIG. 2B) to generate process signal 115A for input to a serial to parallel conversion circuit such as delay line 114D or scan-out circuit 114E.

Delay line 114D may be a lumped-parameter delay line, a charge coupled device (CCD) shift register, a digital shift register, or other well known delay lines. Input signal 115 may be a time-domain signal serially sampled and converted to parallel signal form. At the proper sample time, output signal 115D from delay line 114D or output signal 115F from scan-out circuit 114E may be sampled by processor 116 such as by clocking the processor at the appropriate transformation time, as described hereinafter. Alternately, other well known sampling techniques may be used.

Delay line 114D may be a bipolar or a serial-input and parallel-output MOS-FET shift register, may be a well known CCD shift register, or may be other well known shift register arrangements where shift register 114D may be clocked with a free running clock or a gated clock, as are well known in the art for controlling shift registers. Alternately, delay line 114D may be a lumped-parameter delay line or other well known delay lines.

Decoder and counter combination 114E may be used to scan serial input signal 115 into a plurality of output latches 232 to generate latched parallel output signals 115E to processor 116. Counter 231 may be an SN74163 counter continuously clocked and continuously changing the address to input terminals A to D of decoder 230. Decoder 230 may be an SN74154 4-line to 16-line decoder having complement outputs $\overline{0}$ to $\overline{15}$ and flip-flops 232 may be SN7474 flip-flops. Counter 231 may be reset with clear signal CR which may be initialize signal and may be clocked with the sample clock signal CKS to sequence a binary count defined by counter signals QA to QD to address decoder 230 at input terminals A to D respectively. As counter 231 sequences through the counter states, decoder 230 is addressed to select one of a plurality of flip-flops 232 in sequence with selection signals from outputs $\overline{0}$ to $\overline{15}$ to the clock inputs of flip-flops 232 to load the condition of signal 115. Input signal 115 is sequentially sampled with flip-flops 232 at the rate of sample clock CKS. Therefore signals 115E represent a sequence of time-domain samples latched by flip-flops 232.

Clocks to flip-flops 232 are selected with addresses from counter 231 and are gated with inverted sample clock CKS to gate inputs G1 and G2 of decoder 230 to eliminate a race condition. In one embodiment counter 231 and D flip-flops 232 may be positive edge triggered circuits. Therefore, counter 231 will change state at the positive edge of the input clock signal CKS, resulting in the changing of the address QA to QD, rippling through decoder 230 to output clock signals $\overline{0}$ to $\overline{15}$. In order to preclude a race condition, decoder outputs 0VS/0/ to $\overline{15}$ may be gated with inverted sample clock CKS to inputs G1 and G2 of decoder 230, where the positive edge of clock signal CKS which triggers counter 231 will also cause the outputs of decoder 230 to go to the low state, thereby not clocking positive edge triggered flip-flops 232. When clock signal CKS goes negative, the propagation delay through decoder 230 will have stabilized and the negative going clock signal CKS (positive going inverted clock signal CKS) will cause the selected output of decoder 230 to go high. D flip-flops 232, being positive edge triggered flip-flops, will be clocked by this negative going clock signal CKS (positive going inverted clock signal CKS).

The clock signal may be free running sample clock signal CKS commanding a sample of an input signal such as signal 115A to be latched such as with flip-flop 114B to provide latched output signal 115B. For example, delay line 114D may be an SN74164 serial-in parallel-out register receiving serial input signal 115 at the A and B terminals, generating output signals QA to QH in parallel form and being clocked by clock signal CKS at the desired sample rate. For such a serial-to-parallel converter, the sample clock rate may be significantly faster then the transform clock rate where for example a 512-point transform may require a single pulse from clock CKT to processor 116 for every 512 pulses from sample clock CKS to register 114D. Sample clock CKS may be a free-running clock and may be synchronized with transform clock CKT by using a counter to count-down the sample clock CKS to derive synchronized transform clock CKT.

For simplicity, delay line 114D has been discussed as a single 8-bit register, counter 231 has been discussed as a single 4-bit counter, and decoder 230 has been discussed as a single 4-line to 16-line decoder. As is well known in the art, serial shift registers such as register 114D, counters such as counter 231, and decoders such as decoder 230 may be expanded to accomodate additional digital bits such as by cascading of registers and counters and by selecting decoders with the additional decoding logic. For example, the system discussed relative to FIG. 2C may be expanded to accomodate a 512-point transform by cascading 64 8-bit registers as register 114D, cascading 3 counters 231 to provide nine counter stages and by using 32-decoders 230 with additional decoding logic to select the one of the 32-decoders with spare input G1 to select one of 512 flip-flops 232.

Output Arrangement

Output interface 120 receives signals 119 from processor 116 and/or post processor 118 for communication to output device 122. Output interface 120 may communicate serial information on multiple serial lines, serial information on a shared serial bus, parallel information on multiple sets of parallel lines, parallel information on a shared parallel bus, incremental information on multiple parallel lines, or other forms of information using well known prior art means and methods for communicating digital information as signal 121 to output device 122. In a preferred embodiment, output interface 120 communicates parallel information on a shared parallel bus. One embodiment of a shared parallel bus is discussed with reference to FIG. 3. Tristate output circuits are well known and may be used to communicate information from processor 116 and/or post processor 118 with a shared bus. Such tristate devices may be registers or counters 310 or may be other tristate devices. Alternately, bistate devices may be multiplexed through multiplexer logic. For simplicity of discussion, tristate devices will be discussed. Output device 122 controls counter 231A to address decoder 230A to select one of a plurality of output circuits 310 with decoder signals 312 to output selected information from circuits 310 on shared output bus 313 to output device 122. Output device 122 may clear counter 231A with clear signal to the CR terminal of counter 231A or alternately may load counter 231A with an address. Output device 122 may clock counter 231A to sequence through a set of addresses to sequentially enable the outputs of the circuits 310 to be placed onto output bus 121A for communication to output device 122. Counter 231A and decoder 230A may be connected as discussed relative to FIG. 2C for sequencing through states of counter 231, addressing decoder 230, gating the outputs of decoder 230 with a clock signal to decoder input G2, and selecting the appropriate circuit 310 with decoder outputs 312. Further, counter 231A and decoder 230A may be expanded as discussed relative to FIG. 2C above.

Output device 122 may control outputting of information 121A fully synchronized with operation of output device 122 by clearing counter 231A, clocking counter 231A, and loading information from bus 313 in response to the low state of the clock to the CK terminal of counter 231A. Therefore, in accordance with the above description, information may be transferred to output device 121 fully synchronized with the operation of output device 122, by efficient use of interface lines and interface circuitry.

Output device 122 may be a stored program digital computer, a special purpose micro-programmed processor, hardwired logic, a data link for communication of information, or other output devices. Although many components do not have tristate outputs such as counter 118A (FIG. 5A) exemplified with an SN74193 up-down counter having binary outputs, tristate output circuits are well known in the art and can be implemented by one skilled in the art. Alternately, multiplexing logic in place of tristate logic is well known in the art. Therefore, tristate outputs or multiplexing logic for multiplexing outputs of registers and counters onto a common bus are well known in the art, and may be used in combination with the registers and counters discussed herein for the bus multiplexing arrangement discussed with reference to FIG. 3.

Processor

Processor 116 may be any digital processor but in a preferred embodiment will be discussed as an incremental fast Fourier transform (FFT) processor. FFT processors are well known in the art such as described in detail in the referenced textbook by Rabiner and Gold. For example, FFT mechanizations are described in Section 6 and Section 10 therein, where FFT mechanizations are discussed with reference to FIGS. 6.1 to 6.3, 6.11 to 6.14, 10.1 to 10.9, 10.13 to 10.15, and elsewhere therein. These figures present a graphical representation of an FFT mechanization, wherein each node point in those figures may be implemented with multiplication, addition, and subtraction functions, particularly with respect to complex numbers such as set forth in equations 6.11 to 6.14 and characterized by a butterfly computation discussed with reference to FIG. 6.4 and elsewhere therein. Therefore, FFT mechanizations are well known in the art and may be synthesized or constructed as butterfly arrangements which in turn can by synthesized or constructed with multiplication, addition, and subtraction operations. Whole-number multiplication, addition, and subtraction operations are discussed in said textbook by Rabiner and Gold such as with array circuits for multiplication and whole-number arithmetic circuits for addition and subtraction.

In accordance with one feature of the present invention, an incremental processor provides significant advantages over the prior art whole-number processors such as the whole-number processors discussed in said textbook by Rabiner and Gold. An incremental processor mechanization will now be discussed for processor 116 (FIG. 1) to mechanize the multiplication, addition, and subtraction operations needed to synthesize a butterfly computation and an FFT computation. It will be recognized that these general arithmetic operations are generally applicable to many kinds of processing including generalized digital filters such as discrete Fourier transforms, correlators, finite impulse response filters, and others such as by implementing sum-of-the-products type of computations and further applicable to general purpose type computations including multiplication, square root, trigonometric function generation, and others as discussed for post processor 118 hereinafter. A preferred embodiment of this generally applicable incremental processor will now be discussed for an FFT mechanization by showing the implementation of incremental multiplication, addition, and subtraction and then showing how these arithmetic operations can be combined to implement a butterfly operation which in turn can be combined to implement an FFT computation.

One form of incremental processor will now be described with reference to FIG. 4. The arrangements shown in FIG. 4A exemplifies how a butterfly computation may be implemented from incremental processor elements, although for simplicity of discussion this arrangement may have differences when compared with a classical butterfly computation. From the teachings herein, one skilled in the art will be able to mplement a butterfly computation or other computations. Equations describing a sum-of-the-products type computation similar to a butterfly computation are set forth in Table 1 as equation-1 to equation-14. Such equations are described in the reference by Rabiner and Gold such as with equations 6.14 and the butterfly diagram in FIG. 6.4 at page 362 therein. Classical butterfly computations generate X and Y signals as a function of A, W, and B (equation-7 and equation-11 in Table 1). These terms may be complex terms containing a real part and an imaginary or quadrature part, wherein the imaginary part is designated with the operator "i". The input signals are the A and B signals, the output signals are the X and Y signals, and internal trigonometric operator signals are the W signals. For example, A and B complex signals may be input, B input signal may be multiplied by a complex trigonometric constant W, and the complex product of W and B may be added to and subtracted from input signal A to generate complex output signals X and Y respectively (equation-7 and equation-11 in Table 1). Constants W may be the sine and the cosine of the trigonometric angle pertaining to the node point, as is well known in the FFT processor art, where the real part of the trigonometric constant $W_R$ represents the cosine of the angle and the imaginary part of the trigonometric constant $W_I$ represents the sine of the angle. As is also well known in the art, the product of complex numbers B and W (equation-1 and equation-2) is a complex number (equation-3 and equation-4) having a real part (equation-5) and an imaginary part (equation-6). From Table 1, it can be seen that a complex multiplication operation involves four simple multiplication operations, an addition operation, and a subtraction operation (equation-3 to equation-6). Further, complex number A and complex product WB can be added and subtracted to generate complex numbers X and Y respectively (equation-7 and equation-14).

TABLE 1

| | |
|---|---|
| $B = B_R + i B_I$ | equation (1) |
| $W = W_R + i W_I$ | equation (2) |
| $B \cdot W = (B \cdot W)_R + i (B \cdot W)_I$ | equation (3) |
| $B \cdot W = (B_R \cdot W_R - B_I \cdot W_I) +$ | equation (4) |
| $i (B_I \cdot W_R + B_R \cdot W_I)$ | |
| $(B \cdot W)_R = B_R \cdot W_R - B_I \cdot W_I$ | equation (5) |
| $(B \cdot W)_I = B_I \cdot W_R + B_R \cdot W_I$ | equation (6) |
| $X = A + W \cdot B = A_R + i A_I +$ | equation (7) |
| $(W \cdot B)_R + i (W \cdot B)_I$ | |
| $X = X_R + i X_I$ | equation (8) |
| $X_R = A_R + (W \cdot B)_R$ | equation (9) |
| $X_I = A_I + (W \cdot B)_I$ | equation (10) |
| $Y = A - W \cdot B = A_R + i A_I -$ | equation (11) |
| $(W \cdot B)_R - i (W \cdot B)_I$ | |
| $Y = Y_R + i Y_I$ | equation (12) |
| $Y_R = A_R - (W \cdot B)_R$ | equation (13) |
| $Y_I = A_I - (W \cdot B)_I$ | equation (14) |

TABLE 2

| P | INPUTS | | | OUTPUTS | |
|---|---|---|---|---|---|
| | B | A | $C_n$ | $\Sigma$ | $C_{n+1}$ |
| P0 | 0 | 0 | 0 | 0 | 0 |
| P1 | 0 | 0 | 1 | 1 | 0 |
| P2 | 0 | 1 | 0 | 1 | 0 |
| P3 | 0 | 1 | 1 | 0 | 1 |
| P4 | 1 | 0 | 0 | 1 | 0 |
| P5 | 1 | 0 | 1 | 0 | 1 |
| P6 | 1 | 1 | 0 | 0 | 1 |
| P7 | 1 | 1 | 1 | 1 | 1 |

The arrangement shown in FIG. 4A illustrates an incremental implementation of a butterfly-type computation (equation-1 to equation-14) and detailed logical circuit implementations thereof are discussed with reference to FIG. 4B to FIG. 4G wherein these arrangements are shown in simplified form to exemplify the features of the present invention and wherein one skilled in the art will be able to implement the incremental processor of the present invention therefrom.

A simplified butterfly operation is shown in FIG. 4A as computation 400. The output of preceding FFT stages illustrated with adders 410, 411, 417 and 418 is shown input to computation 400. Alternately, inputs $dB_R$ and $dB_I$ may be received from input interface 114 which may be input to adders 410 and 411 for latching and synchronization purposes. Signals defined with a d symbol represent incremental signals which may be incremental logical signals such as output from multipliers 450 or may be gated with a clock pulse such as output from adders 430. Subscript R implies the real part of the number and subscript I implies the imaginary part of the number. Terminology in FIG. 4A is consistent with the equations in Table 1 and further consistent with the nomenclature in the textbook by Rabiner and Gold at page 362.

Incremental input signals $dB_R$ and $dB_I$ may be input to incremental multipliers 450 to multiply $dB_R$ by the real part $W_R$ and imaginary parts $W_I$ of constant W and to multiply $dB_I$ by the real part $W_R$ and the imaginary part $W_I$ of the constant W to obtain incremental product signals 424 to be added or subtracted in accordance with equation-7 and equation-11 (Table 1) using adders 430 to generate the incremental real and imaginary parts $d(BW)_R$ and $d(BW)_I$. The real part $BW_R$ and the imaginary part $BW_I$ of the product BW are added to and subtracted from the real part $A_R$ and the imaginary part $A_I$ of number A respectively (equation-7 to equation-14) to generate the real parts $X_R$ and $Y_R$ and imaginary parts $X_I$ and $Y_I$ of complex numbers X and Y as outputs 425. Therefore, FIG. 4A implements a butterfly-type computation (equation-1 to equation-14) and generates X and Y complex output numbers in response to A and B complex input numbers and internal complex constant number W, as described in the textbook by Rabiner and Gold at page 362 therein.

Adder block circuits 430 are discussed in detail with reference to FIG. 4B. Adder 430 may include a pair of flip-flop latches 431 and 432 to latch the two incremental inputs to be added together. Computation 400 has the characteristic that the input increments may occur individually or simultaneously, but the computation is so scaled that if multiple increments occur simultaneously, they cannot again occur at the next computational cycle. For example the maximum incremental rate xay be scaled to be less than one-half of the processing cycle rate for two summed increments, to be less than one-fourth of the processing cycle rate for four summed increments, etc. Therefore, if either or both increments occur, they will be clocked into flip-flops 431 and 432 with transform clock CKT and wherein if either or both input increments are latched with flip-flops 431 and 432, OR-gate 435 will detect this condition and generate an output increment to NAND-gate 439 for gating of the output increment with inverted clock pulse $\overline{CKT}$ to generate incremental data clock pulse d indicative of an incremental sum signal. If both input increments occur simultaneously, AND-gate 433 will detect the set condition of the two flip-flops 431 and 432 and will generate an output carry signal to OR-gate 434 to set flip-flop 431 on the next cycle clock CKT as a carry increment. For a two increment sum computation, the computation is scaled so that input increments have a maximum rate of less than one-half of the cycle rate defined with transform clock CKT. Therefore, if the input increment to flip-flop 431 occurred in a preceding transform cycle and generated a carry signal from gate 433 through gate 434 to set flip-flop 431, then the increment to flip-flop 431 can not again occur on the next subsequent cycle defined by clock CKT and therefore there can only be one input at a time to OR-gate 434. The carry signal from AND-gate 433 to OR-gate 434 preserves the second increment of a double increment condition for generation of a pair of single increments on sequential processor cycles.

Positive increments are processed directly with flip-flops 431 and 432. In a binary arithmetic arrangement, negative increments are inverted with inverter 436. Alternately, a ternary arithmetic arrangement may be implemented using well known methods. Flip-flop 432 is set to either a complemented negative input or an uncomplemented positive input with OR-gate 437. As shown in FIG. 4A, only one of the pair of corresponding plus and minus inputs to adder 430 are used, where use of the positive input requires connecting the negative input to a high state ($V_{cc}$) and use of the negative input requires connecting the positive input to a low state (ground).

If neither of the two input increments to adder 430 are detected, neither the carry increment nor the output increment will be generated with gates 433 and 435. If one and only one of the two input increments to adder 430 are present, the carry increment will not be generated with gate 433 but the output increment will be generated with gate 435. If both input increments to adder 430 are detected, the carry increment will be generated with gate 433 to provide a delayed incremental output signal on the next successive processor cycle and an immediate increment will be generated with gate 435 to provide an immediate incremental output signal on the present processor cycle.

Gating of the inverted clock pulse $\overline{CKT}$ with the output increment signal from OR-gate 435 with NOR-gate 439 will generate an output d-increment synchronous with the clock pulse signal CKT if there is an output d-increment to be generated and eliminating race conditions due to logic propagation delays through flip-flops 431 and 432 and gate 435.

Figure 4B:
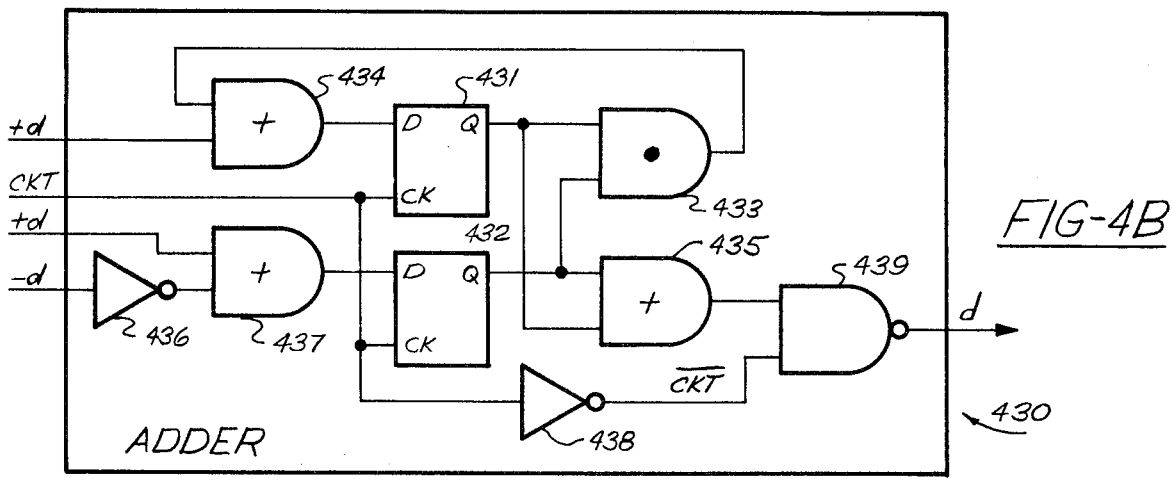

The components in FIG. 4B may be well known SN7400 series components where OR-gates 434, 435, and 437 may be SN7402 OR-gates, inverters 436 and 438 may be SN7404 gates, flip-flops 431 and 432 may be SN7474 D flip-flops, AND-gate 433 may be an SN7408 AND-gate, and NAND-gate 439 may be an SN7400 NAND-gate.

One configuration of an incremental multiplier will now be discussed with reference to FIG. 4C. Other well known incremental multipliers may be digital differential analyzer (DDA) incremental elements such as discussed in the patent entitled Electrically Alterable Digital Differential Analyzer which is incorporated herein by reference and as discussed in the textbooks referenced herein. Multiplier 450 provides incremental multiplication by a constant, where the input is an increment dB and where the constant is either stored or wired into multiplier 450. Multiplier 450 may comprise a plurality of stages 441-443 with expandable arithmetic and logic units using well known integrated circuits with well known expansion techniques. For example, each stage 441-443 may be a four-bit byte and may be cascaded to provide 8, 12, 16, 20, or more bits with cascaded four-bit bytes. Incremental input dB may be provided to the clock of the arithmetic register to change the contents of the register to the sum, but only when an increment dB occurs.

Initial conditions may be preloaded into the registers such as by clearing the registers with the CR signal or by loading the registers with well known register loader techniques. Each stage may have a carry input and a carry output, where the carry input C0 to the first stage may be connected to ground for a zero carry and other carrys may be connected from the carry output C4 to the carry input C0 of the next most significant stage. The last carry output may be used as an overflow for an incremental output. Alternately, for scaling purposes, various intermediate outputs such as summation outputs signal $\Sigma 1$ to signal $\Sigma 4$ may be provided. Alternately, scaling may be provided with a magnitude of the constant W programmed or wired to the arithmetic unit.

Figure 4C:
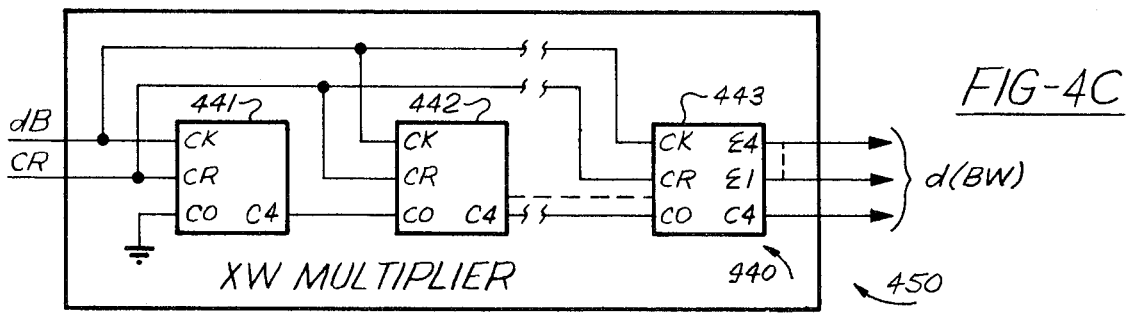

A multiple four-bit byte arrangement is discussed below, although each stage 441-443 xay be single-bit bytes or multiple-bit bytes in well known logical arrangements, A four-bit byte arithmetic unit 440 will now be discussed with reference to FIG. 4D, where each arithmetic unit single byte circuit may be connected as shown in FIG. 4C.

A remainder register 451 may be provided for storing the least significant portion of the summation, where the most significant portion of the summation is output as the carry signal such as from carry output C4. Register 451 may be implemented as quadruple D flip-flop register such as SN74175 quadruple flip-flop register. Each flip-flop in register 451 has a D input line and a Q output line for communication with arithmetic unit 452. Register 451 may be cleared with the CR signal or may be preloaded with well known preloading logic for initialization conditions. Register 451 may be clocked to change the contents to the new computed value.

Arithmetic circuit 452 may be any well known arithmetic circuit such as an SN74283 four-bit full adder as shown in FIG. 4D or an SN74181 ALU as shown in FIG. 4F. Inputs are received from remainder register 451 and from the constant input which may be a register 453 (FIG. 4D) or may be a wired constant 453A (FIG. 4E). An input carry signal C0 may be received from previous stages and an output carry signal C4 may be generated to subsequently more significant stages or as an incremental overflow from the incremental multiplier. Arithmetic unit 452 and 452C use well known carry look ahead logic such as provided with SN74182 logic and discussed in the TTL data book incorporated herein by reference.

Constant register 453 may be an SN74175 register as discussed for remainder register 451 where constant register 453 may be used to store the W-constant and may be loaded with external signals to the 1D to 4D inputs controlled with the clock signal to the input clock CK. Because the W-constant is a constant number for a particular FFT stage, this W-number may be wired into arithmetic unit 452B as shown in FIG. 4E. Arithmetic unit 452B may be the same as the SN74283 arithmetic unit 452 shown in FIG. 4D or the SN74181 ALU shown in FIG. 4F. Constant inputs B1 to B4 may be wired-in, where FIG. 4E shows a high $V_{cc}$ signal to the B1 and B4 inputs and a low ground signal to the B2 and B3 inputs, thereby inputting the number 1001. Any other number may be wired-in by connecting the appropriate inputs B1 to B4 to either $V_{cc}$ or other high signal for a high condition and to ground or other low signal for a low condition. This implementation eliminates the need for constant register 453, thereby reducing circuit requirements, but dedicates the circuit to a particular node of the FFT computation because of the fixed (non-programmable) constant.

In an alternate embodiment, an ALU 452C (FIG. 4F) may be provided for both addition and subtration operations, where input operands are received from the R-register as A0 to A3 input signals and from constant register 433 or wired constant 453A to the B0 to B3 inputs and output operands to the R-register 451 are provided as the F0 to F3 outputs. Similarly, input carry signal $C_N$ and output carry signals G and P may be connected for multiple-byte operation and overflow detection, as discussed for the arrangements shown in FIGS. 4C and 4D. Addition and subtraction may be controlled with the code to the S0 to S3 inputs by selecting the code inputs being either a low or ground signal or a high or $V_{cc}$ sigal with the +d and −d incremental signals commanding either add or subtract operations, respectively. A group of gates 454 may be connected to each of the function inputs S0 to S3 to select the particular function code for addition and subtraction in response to the +d and −d signals.

In a simpler embodiment, a fully incremental system may be implemented with exclusive-OR gate 450A (FIG. 4G) where the input increment may be the dB-signal and the constant increment may be a W-signal. The W-signal may be a single-bit constant as contrasted to the whole-number constant to the B-inputs of arithmetic elements 452, 452B, and 452C: wherein the W-signal may be a single-bit stored in a register such as register 453 or may be a single-bit wired signal to 453A $V_{cc}$ or ground.

Each stage of pipeline processor 116 and 118 may be isolated with a flip-flop which is not shown in FIG. 4G but will become obvious to those skilled in the art from the teachings herein. Alternately, the signals from exclusive-OR gates 450A may ripple through the whole processor or a section of the processor without having intermediate storage flip-flops, thereby providing higher speed operation. At the output, the increments may be summed with counters or other summing devices as discussed herein for post processor 118.

In the arrangement discussed above, incremental multipliers 450 may generate an incremental output when clocked and may preserve that incremental output when not clocked for the next processor cycle. Therefore, adder 430 may interpret that preserved condition as two sequential incremental outputs on successive processor cycles when only a single incremental output should be detected. This condition can be corrected with synchronous one-shot 460 (FIG. 4H) where one-shot 460 can be used for each incremental output from an incremental multiplier 450. The incremental multiplier output is received at the D input of flip-flop 461 and the output of flip-flop 461 is received at the D input of flip-flop 462. Therefore, when $d_{in}$ goes from a low condition to a high condition, flip-flop 461 is clocked to that high condition on the first clock pulse and flip-flop 462 is clocked to that high condition on the second clock pulse. Flip-flops 461 and 462 will be maintained in the high condition until the $d_{in}$ signal goes low, where flip-flop 461 will first be clocked to the low condition with the first subsequent clock pulse and flip-flop 462 will next be clocked to the low condition on the second subsequent clock pulse. Output AND-gate 463 may generate the output increment $d_{out}$ to adders 430, wherein the $d_{out}$ signal will occur once and only once for incremental multiplier output increment independent of how long that increment is maintained in the high state. This is because AND-gate 463 generates the $d_{out}$ signal only when flip-flop 461 is in the high state and flip-flop 462 is in the low state, which is the transitionary condition from the input increment $d_{in}$ going from the low state to the high state. If input increment $d_{in}$ remains in the high state, flip-flops 461 and 462 will both be in the high state and therefore the Q output of flip-flop 462 will disable the output increment $d_{out}$ with AND-gate 463.

Flip-flops 461 and 462 will be reset by the output increment from incremental multiplier 450 going to the low state, thereby causing flip-flops 461 and 462 to be sequentially clocked to the low state, as discussed above, for enabling this synchronous one-shot circuit to again detect the positive transition.

As further discussed above, the computation can be scaled so that the maximum incremental rate is less than one half of the computation or transformation rate, wherein the computation is scaled so that incremental multiplier 450 cannot generate two output increments on two consequtive incremental multiplication operations. Therefore, the incremental output from incremental multiplier 450 must go to the zero output state before again generating an output increment by going to the high output state.

In an alternate embodiment, one-shot flip-flop 461 may be eliminated, where signal 464 may be the incremental output signal such as signal C4 (FIG. 4I) from incremental multiplier 450. In still another alternate embodiment, one-shot flip-flop 462 may be shared with an input flip-flop 431 or 432 of adder 430 (FIG. 4B) using well known logical design methods to integrate the function of synchronous one-shot 460 into adder 430.

Further economies are achieved with the processor of the present invention by recognizing that a wired constant such as discussed with reference to FIG. 4E need not be implemented with a conventional full adder, where a full adder is implemented to process three variables, two operands and a carry, while the wired constant arrangement only requires processing of two variables, a single operand and a carry, thereby permitting simplifications in the circuitry. The logical truth table for a full adder is shown in Table 2, where operands B and A and carry C are used to generate output sum and carry $C_{n+1}$. The sum is one when the number of ones in the three input bits is an odd quantity; i.e., one or three; and the carry output $C_{n+1}$ is one when the three input bits have two or more ones such as P-terms P3, P5, P6, and P7. If one of the operand input bits were fixed because of a wired constant type of mechanization, then half of the logical conditions in Table 2 are not applicable. For example, if the B-operand bit is zero, then only the P0 to P3 terms are pertinent for variable A-operand and $C_n$ bits, where the P4 to P7 terms are not pertinent because the B-operand bit is wired as a zero-bit and therefore cannot assume the one-state. Similarly, if the B-operand bit is one, then only the P4 to P7 terms are pertinent for variable A-operand and $C_n$ bits, where the P0 to P3 terms are not pertinent because the B-operand bit is wired as a one-bit and therefore cannot assume the zero-state. Therefore, a half adder type logical circuit can be utilized for a wired constant where the four states P0 to P3 are implemented for a zero-bit constant and the four states P4 to P7 are implemented for a one-bit constant.

Conventional logical design methods may be used to implement the sum $\Sigma$ and carry $C_{n+1}$ signals for the P0 to P3 terms for a zero bit B-operand or for the P4 to P7 terms for a one bit B-operand. The one or zero subscripts of FIGS. 4J–4L represents the sum bit $\Sigma$ and carry bit $C_{n+1}$ for B-bit one or B-bit zero as defined by the subscript 1 or 0 respectively. An implementation of the P0 to P3 terms with the B-operand bit implied as being a zero bit 470 is shown in FIG. 4J, an implementation of the P4 to P7 terms with the B-operand bit implied as being a one bit 471 is shown in FIG. 4K, and a combined implementation that may be used for B-bit being both a one-bit and a zero-bit 472 is shown in FIG. 4L.

The logical implementation for generating the sum $\Sigma_0$ and carry $C_{(n+1)0}$ bits for two variable input bits A and C with the B-bit being a constant zero can be implemented with circuit 470 (FIG. 4J). AND-gate 473 generates carry terms $C_{(N+1)0}$ and NOR-gate 474 generates the $\overline{A \cdot C_n}$ term to be NORed with the $A \cdot C_n$ term to generate the sum term $\Sigma_0$.

The logical implementation for generating the sum $\Sigma_1$ and carry $C_{(n+1)1}$ bits for two variable input bits A and $C_n$ with the B-bit being a constant one can be implemented with circuit 471 (FIG. 4K). OR-gate 477 generates the $A + C_n$ term, which is the carry output $C_{(n+1)1}$. NAND-gate 476 generates the $\overline{A \cdot C_n}$ term which is ANDed with the $A + C_n$ term using AND-gate 478 to generate the sum term $\Sigma_1$.

An arrangement for generating both the sum $\Sigma$ term and carry $C_{(n+1)}$ term for two variable input bits and $C_n$ with the B-bit being a constant zero or a constant one can be implemented with circuit 472 (FIG. 4L). If the B-bit is implied to be a constant zero, the sum $\Sigma_0$ and the carry $C_{(n+1)0}$ are connected and the sum $\Sigma_1$ and carry $C_{(n+1)1}$ are not connected. Conversely, if the B-bit is implied to be a constant one, then sum $\Sigma_1$ and carry $C_{(n+1)1}$ are connected and the sum $\Sigma_0$ and carry $C_{(n+1)0}$ are not connected. Therefore, logical circuit 472 shown in FIG. 4K may be used for all adder stages independent of the value of the constant, where the value of the constant may be established merely by connecting the sum $\Sigma$ and carry $C_{(n+1)}$ signals having a subscript zero for a zero constant bit or having a subscript one for a one constant bit.

Adder circuits 470–472 (FIGS. 4J–4L) may be connected into incremental multiplier 440 (FIG. 4D) in place of full adder 452. B-inputs B1 to B4 representing the constant B-bits are not implemented in logic and need not be wired because the constant B-bits are implied by circuitry 470–472 (FIGS. 4J–4L). Similarly, constant register 453 (FIG. 4D) and the alternate wired constant 453A (FIG. 4E) are not required but are implied by circuits 470–472 (FIGS. 4J–4L).

Each circuit 470–472 (FIGS. 4J–4L) represents a single stage half-adder to be used in place of each stage full-adder in the four-stage full-adder 452 (FIG. 4D). A-inputs from register 451 to full-adder 452 may be connected to A-inputs of circuits 470–472 (FIGS. 4J–4L). The $C_0$ signal to adder 452 (FIG. 4D) may be input to the $C_n$ terminal of circuits 470–472 of half-adder 470–472 (FIGS. 4J–4L) and the $C_4$ output from full-adder 452 (FIG. 4D) may be generated by the $C_{(n+1)}$ output half-adder 470–472 (FIGS. 4J–4L). The $C_{(n+1)}$ output of each half-adder stage (FIGS. 4J–4L) may be connected to the $C_n$ input of each next significant half-adder stage except for the first stage and last stage having a $C_0$ signal to the $C_n$ input and generating the $C_4$ output with the $C_{(n+1)}$ signal respectively, as discussed below. The three alternate half-adder circuits 470–472 shown in FIGS. 4J–4L represent single-stage half-adder circuits used in place of each of the quadruple single-stage full-adder circuits 452 (FIG. 4D); wherein four-stages of circuits 470–472 (FIGS. 4J–4L) may be used in place of full adder 452 . Half adder circuits 470 or 471 may be selected based upon the implied constant B-bit being a zero or a one respectively. Alternately, half-adder circuit 472 may be used for each of the four-stages shown for quadruple full-adder 452, wherein the implied zero or one state of the constant B-bit may be determined for each stage merely by connecting the zero subscript or one subscript sum $\Sigma$ and carry $C_{(n+1)}$ outputs to imply a zero constant bit or a one constant bit, respectively.

In view of the above, incremental multiplication circuit 440 (FIG. 4D) may be significantly simplified wherein constant register 453 may be eliminated and adder 452 may be reduced to approximately one-half complexity using a type of half-adder in place of a conventional full-adder. A reduction to approximately one-half of the complexity of circuit 440 is indicated by using the concept of multiplication by an implied constant where the constant is neither stored in register 453 nor wired to full-adder logic 452 but is implied by the implementation of half-adder logic 470–472.

Although the wired constant and implied constant embodiments have been discussed herein for a constant sum in an FFT butterfly processor, it is herein intended that these features be generally applicable to other functions such as multiplication, division, exponential, trigonometric, and other functions and that these features be generally applicable to other types of processors such as general purpose, special purpose, wired, and other processors.

Further simplifications include an arrangement for detecting either an underflow or an overflow condition but not both. Still another simplification includes an arrangement for latching an incremental output dz or an incremental input dx such as shown with adder 430 without requiring the latching of both dx and dz.

The processing gain of an FFT exemplifies processing gain associated with other digital filters. Processing gain is achieved by performing a sum-of-the-products computation, where the products may have low resolution such as single-bit or four-bit resolution and the output information may have higher resolution such as eight-bit or sixteen-bit resolution. The greater the number of points in the digital filter, the greater the number of products that are summed together and therefore the greater the number of elements enhancing processing gain. Further, continued summation or integration such as with integration-after-transformation or compositing-after-transformation further enhances processing gain by adding additional products to the output words; thereby increasing the number of products that may be summed together beyond the number of products generated by a single transformation by continuing to add together products from successive transformations in addition to adding together products of the same transformation. Therefore, in accordance with another feature of the present invention, low resolution input information may be used to generate high resolution output information through processing gain of the digital filter and through integration-after-filtering.

Incremental numbers may be scaled using well known prior art scaling methods.

Implementation of an FFT on a sequential processor such as stored program computer requires obtaining of information from the proper location of memory and storing the information back into memory. Algorithms such as data-shuffling and bit-reversal may be used therefore, such as discussed in the textbook by Rabiner and Gold at Section 6.4 therein. The pipeline processing nature of the system of the present invention may provide hardwired interconnection between butterfly computations in contrast to the memory accessing methods of stored programmed computer arrangements. Hardwired interconnections automatically interconnect the appropriate butterfly node points, therefore precluding the need for otherwise considering such data-shuffling, bit-reversal, and other data storage and retrieval methods. Similarly, various FFT mechanizations may be implemented such as radix-2 and radix-4 methods by interconnecting the elemental butterfly computations in the proper form following well known FFT graphical interconnection methods.

Further, many butterfly operations utilize constants that are a function of 0-degrees, 90-degrees, 180-degress, 270-degrees, and multiples thereof; where these sine and cosine functions are either unity or zero. For the unity case, the incremental output may be the same as the incremental input and therefore an incremental multiplier may not be required. For the zero case, the incremental output will be zero, where the incremental multiplier need not be implemented. Therefore, the butterfly type processor described with reference to FIG. 4A may replace multipliers 450 with a jumper wire for a multiplication by unity and an open-circuit for multiplication by zero. For the open-circuit condition, because the input to the next stage adder will be zero for that signal path, the adder may be replaced with a jumper to merely connect the single non-zero adder input signal to the output stage. For example, if $W_R$ represents the sine of 90-degrees for a unity multiplier, then incremental multiplier 412 may be eliminated and incremental signal $dB_R$ may be connected directly to the positive input of adder 416 as signal $d(B_R W_R)$. Similarly, if $W_I$ multiplier 413 is related to the cosine of 90-degrees for a zero multiplier, then incremental multiplier 413 and adder 419 may be eliminated and incremental signal $d(B_I W_R)$ from adder 419 may be deleted; wherein the output from incremental multiplier 415 may be connected directly to the negative input of adder 423 and to the positive input of adder 421 as shown for the $d(BW)_I$ output signal of adder 419.

Although the present invention has been described with reference to a wired incremental parallel pipeline processor, the teachings of the present invention may be implemented in many other forms. For example, incremental operations may be programmed on a general purpose digital computer or may be micro-programmed on a special purpose programmable processor to implement incremental filtering operations with sequential programmable processors.

In an alternate embodiment, the transform clock CKT and the sample clock CKS may be the same wherein a seperate transform may be made on the input signal array for each new sample 115 shifted into delay line 114D (FIG. 2B). In this embodiment, the time-related phase angles between transforms may be different, where a noncoherent integration-after-transformation such as described with reference to FIGS. 5B and 5C may be used in combination therewith.

Incremental processing technology is based upon performing whole-number operations in response to incremental signals. For example, a whole-number signal may be incremented in response to an incremental signal or one whole-number signal may be added to another whole-number signal in response to an incremental signal. One embodiment of an incremental multiplier provides for adding one whole-number signal, the W-constant signal, to another whole-number signal, the R-remainder signal, in response to an incremental command signal; then generating an incremental output signal in response to an overflow or other condition of the R-register number. Further, an arrangement is provided for incremental addition by summing a plurality of incremental signals with an incremental adder.

Incremental computations may be performed in binary or in ternary form. For simplicity of discussion, a binary arrangement is discussed herein where an increment is either positive or negative but is not zero. Alternately, a ternary system may be implemented from the teachings herein as discussed in the referenced patent Electrically Alterable Digital Differential Analyzer. Further, binary and ternary signal processing is well known in the DDA art and may be used with the incremental processor of the present invention. Still further, incremental processing permits communication to be achieved with incremental signals, where communication of incremental signals significantly reduces interconnections when compared to communication of whole-number signals. This can be seen with reference to FIG. 4 where interconnections between multiplication and addition computational elements require only single binary or dual ternary incremental signals and not whole-number signals, where whole-number signals may require sixteen parallel lines for data transfers.

The processor of the present invention may be characterized as a parallel pipeline processor because the computations may be performed with whole-number parallel operations. A plurality of butterfly nodal computations may be performed simultaneously at one stage of the FFT operation and a plurality of nodal computations may be performed simultaneously at different stages of the computation having interstage flip-flops for clocking information from stage to stage on a pipeline processor basis. For example, processing of information progresses from the left to the right of the mechanization discussed with reference to FIG. 4A, where interstage flip-flops such as flip-flops 431 and 432 in adders 430 provide interstage storage as information propagates from the left to the right of FIGS. 4A and 4B.

In an alternate embodiment, the arrangement of the present invention may be implemented with DDA computational elements such as disclosed in the referenced patent Electrically Alterable Digital Differential Analyzer.

Resolution of intermediate computational stages may be less than the output resolution of the system, where the W-constants and arithmetic units discussed with reference to FIG. 4 may be only four-bit computational elements and where the output information may be stored in 16-bit or 20-bit counters accumulating output incremental solutions. Therefore, further economy may be achieved by varying resolution of the incremental computations through the processor.

In one example, a 512-point transform may be implemented having 9-stages ($\log_2 512 = 9$), where resolution of each stage may be the same or may be different. For example, all stages may have four-bit resolution or eight-bit resolution to generate a sixteen-bit output number. Alternately, the first-stage may have four-bit resolution, the second-stage xay have five-bit resolution, the third-stage may have six-bit resolution and each successive stage may have greater resolution until the ninth-stage may have twelve-bit resolution. Alternately, each stage may only have single-bit resolution such as discussed for the single-bit multiplier with reference to FIG. 4G and as discussed in detail in the referenced application Method And Apparatus For Signal Enhancement With Improved Digital Filtering.

The processor of the present invention is low in cost, low in power consumption, small in size, and low in weight because of a low component count. Several methods are used to reduce components. The primary component reduction is acheived with the incremental processing arrangement as contrasted to prior are whole-number processing arrangements. Further improvements are acheived by recognizing that the butterfly computations represent multiplication by a constant, thereby permitting significant simplification of multiplication circuits over incremental multiplication for two variables. Still further component reductions are acheived by recognizing that addition of a variable to a fixed constant does not require a full-adder but only requires a form of half-adder because one of the three inputs to a full-adder is a fixed and non-variable constant. Other features of the present invention further enhance efficiency, speed, and other characteristics.

Post Processor

Post processor 118 may be implemented with incremental processing elements such as the implementation of improved elements discussed with reference to FIG. 4 for processor 116 or alternately may be other incremental processing elements such as digital differential analyzer (DDA) elements as discussed in the patent Electrically Alterable Digital Differential Analyzer and in the textbook by Braun at Chapter 8 therein and further in the prior art literature.

Figure 5A:
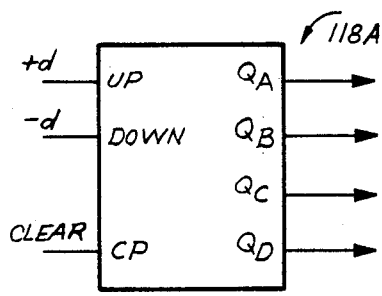
FIG. 5 is a block and schematic diagram of an incremental post processor in accordance with the present invention comprising FIG. 5A showing an incremental counter, FIG. 5B showing an incremental sum-of-the-squares computation, FIG. 5C showing an incremental root-sum-of-the-squares computation, and FIG. 5D showing an incremental multiplier computation in accordance with a preferred embodiment of the present invention.

In one embodiment of pulse processor 118, a coherent integration arrangement may be provided, as discussed with reference to FIG. 5A. Coherent integration pertains to separate integration of real and imaginary parts of the signal to preserve separation of real and imaginary parts. This is contrasted to noncoherent integration which combines real and imaginary quadrature signal components with an RSS type computation, as discussed with reference to FIG. 5B herein. Coherent integration preserves phase relationships of signals, which may be used for functions such as extrapolating phase to precisely predict time of arrival of pulses such as with a ranging system. Alternately, noncoherent integration may be used to eliminate phase-related errors such as phase jitter, motion of tracked vehicles, and other such affects.

Coherent integration will now be discussed with reference to FIG. 5A. The outputs of processor 116 may be incremental signals and may be output from adders 430. Adders 430 are used to sum incremental signals and also used to interface incremental signals such as for pipeline buffering with flip-flops 431 and 432 and clock gating of incremental signals with gate 439 (FIG. 4B). Positive incremental signals +d and negative incremental signals −d may be subtracted and integrated with an up-down counter 118A which may be an SN74193 up-down counter as shown in FIG. 5A. The system may be initialized such as with an interface clear signal to the CR input of counter 118A or alternately counter 118A may be pre-loaded with initial conditions consistent with the loading capability of an SN74193 counter circuit. Incremental signals +d and −d will cause counter 118A to increment in response to the +d signal for up-counting and to decrement in response to the −d signal for down-counting; thereby adding positive increments +d and subtracting negative increments −d; yielding the double functions of incremental subtraction and incremental accumulation or integration. The number contained in counter 118A represents the sum of the incremental difference or the intergral of the incremental difference for integration after transformation capability. It should be recognized that the incremental subtraction capability is discussed for generality, where many systems may count only positive increments or negative increments and may not use the incremental subtraction capability discussed with reference to FIG. 5A.

Figure 5B:
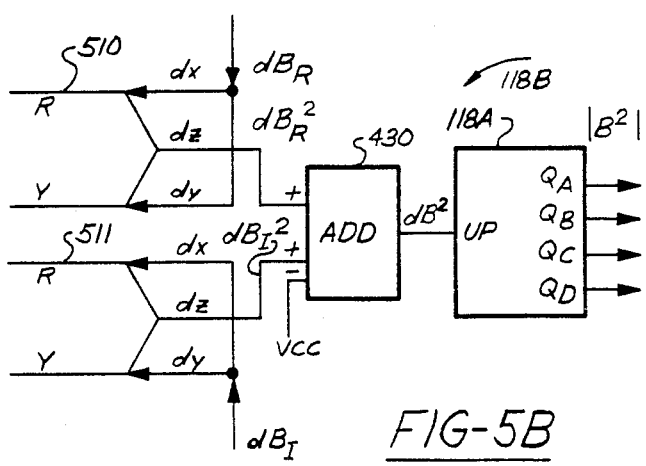
Figure 5C:
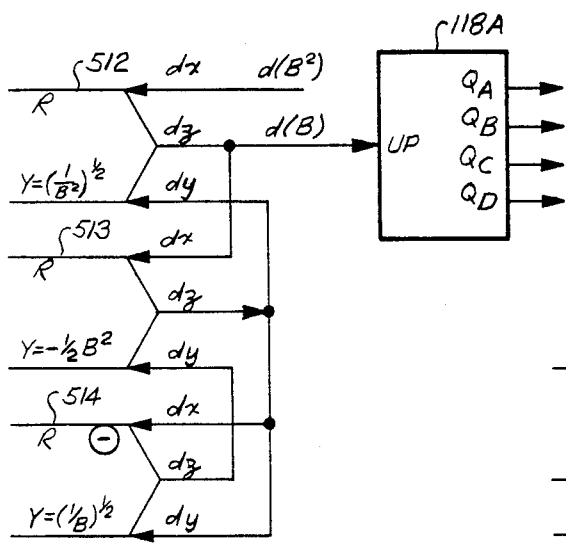

Noncoherent integration will now be discussed with reference to circuit 118B (FIG. 5B). DDA integrators 510 and 511 generate the squares of incremental inputs $dB_R$ and $dB_I$ and incremental adder 430 generates the sum-of-the-squares of the incremental inputs yielding a sum-of-the-squares signal $dB^2$ to counter 118A. The square-root-of-the-sum-of-the-squares calculation or root-sum-square calculation (RSS) converts from coherent signals $dB_R$ and $dB_I$ to noncoherent signals $dB^2$ for noncoherent integration with counter 118A as discussed for coherent integration with reference to FIG. 5A. The square-root operation may not be required as shown in the implementation of FIG. 5B or may be provided as shown in the implementation of FIG. 5C. It may not be necessary to generate the square-root explicitely, wherein the integral of the sum-of-the-squares may be taken by summing or integrating the sum-of-the-squares from adder 430 using counter 118A. This integral of the sum-of-the-squares is the same as the square of the integral of the root-sum-of-the-squares. Therefore, a square-root may be taken before integration such as with a square-root DDA incremental processor (FIG. 5C) inserted inbetween adder 430 and integrator 118A or may be taken after integration such as with output device 122 which may generate the square-root of the output of post processor 118 if in squared form. Alternately, output device 122 may perform processing of the output of post processor 118 in squared form. Therefore, although a square-root operation is not shown in FIG. 5B, a square-root operation either may be generated incrementally such as a square-root of the $dB^2$ signal from adder 430 (FIG. 5C) before integration. Alternately, a square-root operation may be generated after integration by taking the square-root of the whole-number parameter output from counter 118A such as with a general purpose digital computer in output device 122. Still further, information may be processed in squared form without explicitly taking the square-root, wherein the square-root operation is not required for combining of coherent signals to generate a noncoherent signal or for noncoherent integration but primarily to make the units consistant with other parameters in the system.

Integrator 510 receives the real part of the incremental B-signal $dB_R$ as the dx input and dy input and generates the square of the incremental input as the $dB^2$ signal from the dz output. Similarly, integrator 511 receives the imaginary part of B-signal $dB_I$ as the dx input and the dy input and generates the square of the incremental input as the $dB_I^2$ signal from the dz output. The squaring operation is performed by updating the Y-register number with the dy input by adding the dy input increment to the Y-register number; by adding the Y-register number to the R-register number under control of the dx incremental input; and by detecting overflow of the R-register as the dz output incremental. The incremental square signals $dB_R^2$ and $dB_I^2$ are incrementally added with adder 430 to generate noncoherent incremental square signal $dB^2$ for integrating with counter 118A, as discussed for coherent signal integration with reference to FIG. 5A. This integration generates the whole-number integral of the sum of the squares of complex incremental signals $dB_R$ and $dB_I$ as output signals QA–QD of counter 118A.

An incremental processing arrangement to generate the RSS of the $dB_R$ and $dB_I$ signals (FIG. 5B) will now be discussed with reference to FIG. 5C. The sum-of-the-squares is shown generated in FIG. 5B where the incremental $dB^2$ signal from adder 430 is summed or integrated with counter 118B to generate the absolute magnitude signal $B^2$ as the output of counter 118A. Incremental signal $dB^2$ (FIG. 5B) may be processed with the arrangement shown in FIG. 5C using incremental processors 512–514 and incremental summer 118A to generate noncoherent whole-number B output. Processors 512–514 implement an incremental square-root function, where incremental output dB is generated in response to incremental input $dB^2$ to be summed or integrated with counter 118A to generate noncoherent or absolute magnitude whole-number signal $|B|$. The incremental $B^2$ signal $d(B^2)$ from adder 430 (FIG. 5B) is input as the independent variable to incremental processor 512. The dz output of processor 512 drives incremental processor 513 which in turn drives incremental processor 514 with independent variables from the dz outputs. The arrangement shown in FIG. 5C generates incremental square-root signal d(B) in response to the incremental input signal $d(B^2)$, where the incremental square-root signal d(B) is summed or integrated with counter 118A to generate a whole-number output $|B|$ which is the absolute magnitude or root-sum-of-the-squares of the real and imaginary components $dB_R$ and $dB_I$ input to the arrangement of FIG. 5B. Alternately, the Y-registers of incremental processors 512–514 contain whole-number exponential and reciprocal functions of incremental input B and may be used as whole-number outputs from post processor 118 to output device 122.

Figure 5D:
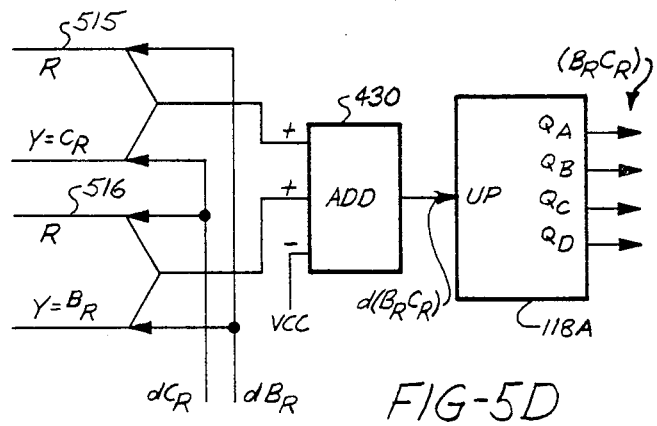

An incremental multiplication by two variables may be performed with the arrangement shown in FIG. 5D to implement various frequency-domain computations such as correlation, convolution, and power products. Multiplication may be performed coherently by separately implementing real and imaginary signal component products with the arrangement shown in FIG. 5D for the real part of the B-number $B_R$ and real part of the C-number $C_R$. Alternately, multiplication may be implemented noncoherent such as by using noncoherent incremental signal $d(B^2)$ (FIGS. 5B and 5C).

In an alternate embodiment incremental signal $dB_R$ may be generated with incremental processors from input information while incremental signal $dC_R$ may be a reference parameter that is generated for comparison with processed signal $dB_R$ such as for incremental multiplication between a processed signal $dB_R$ and a reference signal $dC_R$ such as for correlation and convolution. Incremental parameters $dB_R$ and $dC_R$ may be accumulated in Y-registers of incremental processors 515 and 516 (FIG. 5D) by summing input increments. The incremental inputs are also used to control adding of the Y-register to the R-register of incremental processors 515 and 516 to generate incremental overflow outputs related to $C_R d(B_R)$ from processor 515 and $B_R d(C_R)$ from processor 516 to be summed with incremental adder 430 to generate an incremental product of two variables $d(B_R C_R)$ such as for summing with integrating counter 118A to generate whole-number output $B_R C_R$.

Similarly, Y-registers in processors 515 and 516 accumulate and store signals $dC_R$ and $dB_R$ respectively to provide the whole-number parameters $C_R$ and $B_R$ respectively which may be output directly from the Y-registers of processors 515 and 516 to output device 122.

For simplicity of illustration, the arrangements in FIG. 5 have been discussed for a four-bit counter 118A and for real and imaginary incremental signals. Counter 118A may be expanded using well known methods from the single four-bit byte provided with a single SN74193 circuit to multiples of four-bit bytes.

Further, the incremental processors may process coherent imaginary incremental signal components, coherent real incremental signal components, and noncoherent incremental signal components. These processors may be paralleled as required to process real and imaginary coherent incremental components or noncoherent incremental components for each output channel of processor 116, wherein the single channel embodiments discussed with reference to FIG. 5 provides convenient illustration of the teachings of the present invention and may be readily duplicated or expanded for each of a plurality of channels. Further, post processor 120 may include other incremental processors such as exponential generators; trigonometric generators such as sine and cosine generators, tangent generators, secant generators, arc tangent generators; root generators; logrithmetic and antilogrithmic generators; hypobolic function generators such as hypobolic sines, cosines, and tangents; and other such functions as are well known in the incremental processing art.

REFERENCES

Technology associated with implementation of the system of the present invention is well known in the art such as with circuit design, logical design, and programming. Further, prior art systems provide background for the system of the present invention. Still further, issued patents define well known methods and arrangements. References are provided hereinafter to prior art documents, systems, and patents; wherein the documents listed hereinafter and documents listed therein are incorporated herein by reference.

Digital filtering systems are well known in the art and provide a basis for the improvements of the present invention. Such prior art systems include:

1. the Acoustic Imaging System built by Bendix Corp. of Sylmar, Calif. for the Naval Undersea Research and Development Center in San Diego, Calif.;
2. the Computer Augmented Field Data Recording System (CAFDRS) built by United Geophysical of Pasadena, Calif.; and
3. the GEOCOR system built by Geophysical Systems Corp. of Pasadena, Calif.

Documents on digital filtering include:

1. DIGITAL SIGNAL PROCESSING by Robiner and Radner for the IEEE Press (1972);
2. THE FAST FOURIER TRANSFORM AND ITS IMPLEMENTATION by Butler and Harvey;
3. SEISMIC FILTERING by Rothenburg and Van Nostrand for the Society of Exploration Geophysicists (1971)
4. ENCYCLOPEDIC DICTIONARY OF EXPLORATION GEOPHYSICS by Sheriff for the Society of Exploration Georphysicists (1973);
5. THE ROBINSON-TREITEL READER by Seismograph Service Corp. (1973);
6. CORRELATION TECHNIQUES—A REVIEW by Anstey for Geophysical Prospecting XII;
7. THE THEORY AND DESIGN OF CHIRP RADARS by Klauder in The Bell System Technical Journal vol XXXIX no 4 (July 1960);
8. A CURRENT DISTRIBUTION FOR BROADSIDE ARRAYS WHICH OPTIMIZES THE RELATIONSHIP BETWEEN BEAM WIDTH AND SIDE-LOBE LEVEL by Dolph in the Proceedings of the IRE and Waves and Electrons (June 1946);
9. DESIGNERS GUIDE TO DIGITAL FILTERS by Leon and Bass in EDN magazine (January 1974–June 1974);
10. THE SPECTRUM OF CLIPPED NOISE by Van Vleck and Middleton in the Proceedings of the IEEE (January 1966);
11. DIGITAL SIGNAL PROCESSING by Oppenheimer and Schafer for Prentice Hall (1974);
12. THE FAST FOURIER TRANSFORM by E. Oran Brigham for Prentice Hall Inc. (1974); and
13. THEORY AND APPLICATION OF DIGITAL SIGNAL PROCESSING by Lawrence R. Rabiner and Bernard Gold for Prentice Hall (1975).

Issued patents provide a basis for the improvements of the present invention including U.S. Pat. Nos. 2,624,876; 2,678, 997; 2,688,124; 2,760,164; 2,808,577; 2,874,795; 2,910,134; 3,011,582; 3,018,962; 3,024,994; and 3,065, 453.

Documents on circuit design include:

1. METHODS FOR SOLVING ENGINEERING PROBLEMS USING ANALOG COMPUTERS by Levine for McGraw Hill (1964);
2. ANALOG COMPUTERS by Korn and Korn; and
3. JUNCTION TRANSISTOR ELECTRONICS by Hurley for John Wiley & Sons (1958).

Documents on logical design include:

1. DIGITAL COMPUTER DESIGN FUNDAMENTALS by Chu for McGraw Hill (1962);
2. DIGITAL COMPUTER DESIGN by Braum for Academic Press (1963); and 3. THE TTL DATA BOOK by Texas Instruments Inc (1973).

GENERAL CONSIDERATIONS

The system of the present invention is intended to be generally applicable to the fields of signal processing, data processing, and digital filtering. Although the present system may be described with a Fourier transform digital filter, descriptions are intended to be merely exemplary of the broad scope of the present invention. For example, the transform processor is intended to generally exemplify digital filters or signal processing arrangements having broad scope. The disclosed applications intended to exemplify a broad range of signal processing and data processing applications including radar, underwater acoustics, medical diagnostics, equipment diagnostics, and a broad range of other applications. Further, the processing of single-bit input data to achieve high resolution output data is intended to exemplify the general concept of processing low-resolution input data to obtain high-resolution output data. The discussions relative to a correlator data processor are intended to exemplify generalized data processing arrangements including a convolution processor, a deconvolution processor, and a Fourier transform processor.

Components have been shown in the figures in simplified schematic form to more easily exemplify the present invention, wherein circuit design is a well known art and wherein use of such components are well known in the art. Further, many alternate circuit embodiments and component types may be used to implement the discussed embodiments.

Although the presently preferred embodiment has been discussed for a parallel-word parallel-pipeline processor, other arrangements of the system of the present invention may be provided. For example, a serial-word incremental processor may be used in place of the parallel-word incremental processor, wherein a single serial arithmetic and control unit may be shared with all bits in a word such as for incremental multiplication and addition. Alternately, serial or parallel incremental multipliers and adders may be shared such as with serial DDA techniques for processing a plurality of incremental multipliers and adders with shared arithmetic logic and with incremental and whole-number parameters stored in a memory such as for the TRICE and other incremental processors. Still further, registers having similar parameters may be shared. For example, the common $W_R$ constant may be shared between incremental multipliers 412 and 415 and the common $W_I$ constant may be shared between incremental multipliers 413 and 414 (FIG. 4A).

Incremental processors have been described using a parallel-word parallel-computation architecture. Alternately, a serial-word serial-computation, serial-word parallel-computation, or parallel-word serial-computation arrangement may be provided.

From the above description it will be apparent that there is thus provided a device of the character described possessing the particular features of advantage enumerated as desireable, but which obviously is susceptible to modification such as in its form, method, mechanization, operation, detailed construction, and arrangement of parts.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect and the invention is therefore claimed in any of its forms or modifications within the legitimate and valid scope of the appended claims.

What I claim is:

1. A data processing system comprising:
    input means for generating at least one incremental time related input signal and
    incremental Fourier transform processor means for generating an incremental frequency related processed signal in response to the incremental time related input signal.

2. A data processing system comprising:
    input means for generating at least one incremental time related input signal and
    incremental fast Fourier transform processor means for performing a fast Fourier transform computation to generate an incremental frequency related processed signal in response to the incremental time related input signal.

3. The system as set forth in claim 1 above, wherein said processor means includes incremental complex multiplication means for generating the processed signal as a complex product in response to the incremental time related input signal.

4. The system as set forth in claim 1 above, further comprising:
    transducer means for generating an analog input signal;
    wherein said input means includes means for generating the incremental time related input signal in response to the analog input signal from said transducer means.

5. The system as set forth in claim 1 above, further comprising:
    means for generating an analog input signal;
    wherein said input means includes means for generating the incremental time related input signal as a binary digital signal in response to a threshold of the analog input signal.

6. The system as set forth in claim 1 above, wherein said processor means includes means for generating the incremental frequency related processed signal in response to the incremental time related input signal and a constant number.

7. The system as set forth in claim 1 above, wherein said processor means includes add means for generating an incremental sum signal in respone to the incremental incremental time related input signal and means for generating the incremental frequency related processed signal in response to the incremental input signal responsive sum signal.

8. The system as set forth in claim 1 above, wherein said processor means includes means for generating an incremental difference signal in response to the incremental time related input signal and means for generating the incremental frequency related processed signal in response to the incremental input signal responsive difference signal.

9. The system as set forth in claim 1 above, further comprising means for generating a whole number digital signal in response to the incremental frequency related processed signal, from said incremental Fourier transform processor means.

10. A data processing system comprising:

input means for generating at least one incremental time related input signal and incremental Fourier transform processor means for generating an incremental frequency related processed signal in response to the incremental time related input signal; said incremental Fourier transform processor means including pipeline Fourier processor means for performing a pipeline Fourier processing computation to generate the incremental frequency related processed signal in response to the incremental time related input signal.

11. A data processing system comprising:
input means for generating at least one incremental time related input signal and
incremental Fourier transform processor means for generating a frequency related processed number in response to the incremental time related input signal, said processor means including
 a. means for storing a constant number;
 b. means for storing the frequency related processed number;
 c. means for generating at least one incremental product signal in response to an incremental product of the constant number from said constant number storing means and the incremental time related input signal from said input means; and
 d. means for updating the frequency related processed number from said processed number storing means in response to the incremental product signal from said incremental product signal generating means.

12. The system as set forth in claim 11 above, wherein said constant number storing means includes register means for storing the constant number and loading means for loading the constant number into said register means.

13. The system as set forth in claim 11 above, wherein said constant number storing means includes wired constant means for storing a wired constant as a wired connection.

14. The system as set forth in claim 11 above, wherein said constant number storing means includes implicit constant number means for implying the stored constant number.

15. The system as set forth in claim 10 above, wherein said constant number storing means includes means for storing a whole number constant number and wherein said incremental product generating means includes means for generating the incremental product signal in response to the whole number constant number from said whole number constant number storing means and the incremental time related input signal from said input means.

16. A data processing system comprising:
input means for generating at least one incremental time related input signal;
incremental Fourier transform processor means for generating at least one incremental frequency related processed signal in response to the incremental input signal; and
post processor means for generating at least one incremental post processed signal in response to the incremental frequency related processed signal from said incremental Fourier transform processor means.

17. The system as set forth in claim 16 above, further comprising means for generating a digital whole number signal in response to the incremental post processed signal from said post processor means.

18. A data processing system comprising:
input means for generating incremental time related input signal samples;
incremental Fourier transform processor means for generating incremental frequency related processed signal samples in response to the incremental input signal samples from said input means; and
coherent means for generating coherent whole number signal samples in respone to the incremental frequency related processed signal samples from said processor means.

19. A data processing system comprising:
input means for generating incremental time related input signal samples;
incremental Fourier transform processor means for generating incremental frequency related processed signal samples in response to the incremental input signal samples from said input means; and
noncoherent means for generating noncoherent whole number signal samples in response to the incremental frequency related processed signal samples from said processor means.

20. A digital data processing system comprising:
transducer means for generating analog transducer signals in response to sensed analog input signals;
signal processor means for generating processed analog signals in response to the analog transducer signals from said transducer means;
converter means for generating incremental input signals in response to the processed analog signals from said signal processor means;
transform processor means for generating frequency domain incremental signals in response to the incremental input signals from said converter means, said transform processor means including
 a. butterfly processing circuits for generating butterfly incremental signals in response to the incremental input signals and
 b. means for connecting said butterfly processing circuits to generate the frequency domain incremental signals in response to the incremental input signals from said converter means; and
output processor means for generating whole number digital output signals in response to the frequency domain incremental signals from said transform processor means.

21. The system as set forth in claim 20 above, wherein each of said butterfly processing circuits includes:
first incremental multiplication means for generating a first incremental product signal in response to a first one of the incremental input signals and a first whole number digital constant stored therein;
second incremental multiplication means for generating a second incremental product signal in response to a first one of the incremental input signals and a second whole number digital constant stored therein;
third incremental multiplication means for generating a third incremental product signal in response to a second one of the incremental input signals and the second whole number digital constant stored therein;
fourth incremental multiplication means for generating a fourth incremental product signal in response to the second one of the incremental input signals and the first whole number constant stored therein;

first incremental arithmetic means for generating a first incremental arithmetic signal in response to a difference between the first incremental product signal and the third incremental product signal;

second incremental arithmetic means for generating a second incremental arithmetic signal in response to a sum of the second incremental product signal and the fourth incremental product signal;

third incremental arithmetic means for generating a third incremental arithmetic signal in response to a sum of the first incremental arithmetic signal and a third one of the incremental input signals;

fourth incremental arithmetic means for generating a fourth incremental arithmetic signal in respone to a sum of the second incremental arithmetic signal and a fourth one of the incremental input signals;

fifth incremental arithmetic means for generating a fifth incremental arithmetic signal in response to a difference between the first incremental arithmetic signal and the third one of the incremental input signals; and sixth incremental arithmetic means for generating a sixth incremental arithmetic signal in response to a difference between the second incremental arithmetic signal and the fourth one of the incremental input signals.

22. The system as set forth in claim 20 above, wherein said transducer means include an antenna for generating the analog transducer signals as microwave electrical signals in response to sensed analog input signals in the form of electromagnetic radiation.

23. The system as set forth in claim 20 above, wherein said transducer means includes microwave transducer means for generating the analog transducer signals as microwave analog transducer signals and wherein said signal processor means includes down converter means for generating the processed analog signals as down converted microwave signals in response to the microwave analog transducer signals from said microwave transducer means.

24. The system as set forth in claim 20 above, wherein said converter means includes a threshold detector for generating the incremental input signals in response to a threshold-related condition of the processed analog signals from said signal processor means.

25. The system as set forth in claim 20 above, wherein said transform processor means includes Fourier transform processor means for generating the frequency domain incremental signals in response to the incremental input signals from said converter means.

26. The system as set forth in claim 20 above, wherein said transform processor means includes discrete Fourier transform processor means for generating the frequency domain incremental signals in response to the incremental input signals from said converter means.

27. The system as set forth in claim 20 above, wherein said output processor means includes integration means for generating the whole number digital output signals in response to integration of the frequency domain incremental signals from said transform processor means.

28. The system as set forth in claim 20 above, further comprising integration means for generating integrated frequency domain whole number digital signals in response to the whole number digital output signals from said output processor means.

29. The system as set forth in claim 20 above, further comprising coherent integration means for generating coherent integrated signals in response to integration of the whole number digital output signals generated with said output processor means.

30. The system as set forth in claim 20 above, further comprising non-coherent integration means for generating non-coherent integrated signals in response to integration of the whole number digital output signals from said output processor means.

31. The system as set forth in claim 20 above, wherein said butterfly processing circuits include a plurality of digital differential circuits for generating the butterfly incremental signals in response to the incremental input signals.

32. The system as set forth in claim 20 above, wherein said transducer means includes an acoustical transducer for generating the analog transducer signals as acoustical signals in response to the sensed analog input signals in the form of acoustical input signals.

33. A filtering system comprising:
input means for generating a plurality of time domain signal samples;
filter means for generating a plurality of frequency domain signal samples in response to the time domain input signal samples; and
integrating means for generating a plurality of integrated signal samples in response to the frequency domain signal samples.

34. A filtering system comprising:
input means for generating a plurality of time domain signal samples;
Fourier transform means for generating a first plurality of Fourier transform frequency domain signal samples related to a first Fourier transform and a second plurality of Fourier transform frequency domain signal samples related to a second Fourier transform in response to the time domain signal samples from said input means; and
integrating means for summing each of a plurality of said first plurality of Fourier transform frequency domain signal samples with a related one of said second plurality of Fourier transform frequency domain signal samples to generate a plurality of integrated Fourier transform frequency domain signal samples.

35. A filtering system comprising:
input means for generating a plurality of incremental time domain signal samples;
incremental filter means for generating a plurality of incremental frequency domain signal samples in response to the incremental time domain input signal samples; and
integrating means for generating a plurality of integrated signal samples in response to the incremental frequency domain signal samples.

36. A filtering system comprising:
input means for generating incremental time related signal samples and
incremental processor means for generating incremental frequency related signal samples in response to the incremental time related signal samples.

37. A filtering system comprising:
input means for generating incremental time related signal samples and
incremental Fourier transform processor means for generating incremental frequency related signal samples in response to the incremental time related signal samples.

38. A filtering system comprising:

input means for generating time related signal samples;

incremental processor means for generating incremental frequency related signal samples in response to the incremental time related signal samples; and integration means for generating whole number digital signal samples in response to the incremental frequency related signal samples.

39. A Fourier transform processor for generating Fourier transformed incremental output signals in response to incremental input signals, said Fourier transform processor comprising:

incremental means for incrementally generating the transformed incremental output signals in response to the incremental input signals and integration means for generating digital whole number output signals in response to the incremental output signals.

* * * * *